(12) United States Patent
Suzuki et al.

(10) Patent No.: US 9,136,290 B2
(45) Date of Patent: Sep. 15, 2015

(54) SOLID STATE IMAGING DEVICE, PORTABLE INFORMATION TERMINAL DEVICE AND METHOD FOR MANUFACTURING SOLID STATE IMAGING DEVICE

(75) Inventors: Kazuhiro Suzuki, Tokyo (JP); Risako Ueno, Tokyo (JP); Honam Kwon, Kanagawa-ken (JP); Mitsuyoshi Kobayashi, Kanagawa-ken (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 13/416,036

(22) Filed: Mar. 9, 2012

(65) Prior Publication Data

US 2013/0075587 A1 Mar. 28, 2013

(30) Foreign Application Priority Data

Sep. 27, 2011 (JP) .................................. 2011-210649
Jan. 17, 2012 (JP) .................................. 2012-007150

(51) Int. Cl.
*H01L 27/146* (2006.01)

(52) U.S. Cl.
CPC .... *H01L 27/14618* (2013.01); *H01L 27/14627* (2013.01); *H01L 27/14685* (2013.01)

(58) Field of Classification Search
CPC .................. H01L 27/14625; H01L 27/14627; H01L 27/14685; G02B 3/0037; G02B 3/0056
USPC .................... 250/208.1, 214.1; 257/432, 436, 257/E31.127; 438/66, 69, 71; 348/340, 348/360; 359/619, 620
See application file for complete search history.

(56) References Cited

U.S. PATENT DOCUMENTS

| | | | |
|---|---|---|---|
| 2009/0115875 A1 | 5/2009 | Choi et al. | |
| 2010/0096677 A1* | 4/2010 | Inoue | 257/294 |
| 2012/0218448 A1* | 8/2012 | Ueno et al. | 348/273 |
| 2013/0075587 A1* | 3/2013 | Suzuki et al. | 250/208.1 |
| 2013/0128092 A1* | 5/2013 | Ogasahara et al. | 348/335 |
| 2013/0240709 A1* | 9/2013 | Ueno et al. | 250/208.1 |
| 2013/0242161 A1* | 9/2013 | Kobayashi et al. | 348/340 |

FOREIGN PATENT DOCUMENTS

| | | |
|---|---|---|
| JP | 2001-61109 | 3/2001 |
| JP | 2001-156278 A | 6/2001 |
| JP | 2001-284564 A | 10/2001 |
| JP | 2002-171429 A | 6/2002 |
| JP | 2003-250072 A | 9/2003 |

(Continued)

OTHER PUBLICATIONS

U.S. Appl. No. 14/202,402, filed Mar. 10, 2014, Suzuki, et al.

(Continued)

*Primary Examiner* — Kevin Pyo
(74) *Attorney, Agent, or Firm* — Oblon, McClelland, Maier & Neustadt, L.L.P.

(57) ABSTRACT

According to one embodiment, a solid state imaging device includes a sensor substrate having a plurality of pixels formed on an upper face, a microlens array substrate having a plurality of microlenses formed and a connection post with one end bonded to a region between the microlenses on the microlens array substrate and with the other end bonded to the upper face.

17 Claims, 27 Drawing Sheets

(56) References Cited

FOREIGN PATENT DOCUMENTS

| | | | |
|---|---|---|---|
| JP | 2003-283932 A | 10/2003 | |
| JP | 2005-278133 A | 10/2005 | |
| JP | 2005-352345 A | 12/2005 | |
| JP | 2006-067604 A | 3/2006 | |
| JP | 2008-052004 A | 3/2008 | |
| JP | 2008-311354 A | 12/2008 | |
| JP | 2009-049499 A | 3/2009 | |
| JP | 2011-100971 A | 5/2011 | |
| JP | 2013-085212 A | 5/2013 | |
| WO | WO 2010/025401 | 3/2010 | |

OTHER PUBLICATIONS

Japanese Office Action dated Nov. 19, 2014, issued in Japanese Patent Application No. 2012-047373 (with English translation).

Japanese Office Action dated Oct. 16, 2014, issued in Japanese Patent Application No. 2012-007150 (with English translation).

Japanese Office Action dated Jan. 13, 2015, issued in Japanese Patent Application No. 2012-007150 (with English translation).

* cited by examiner

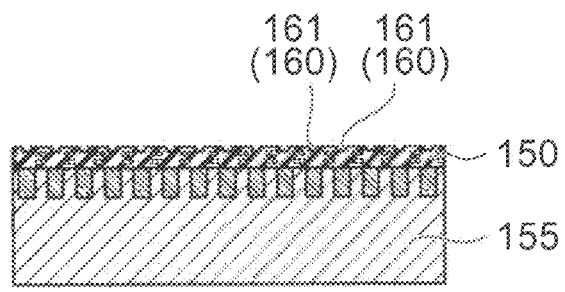
FIG. 36A
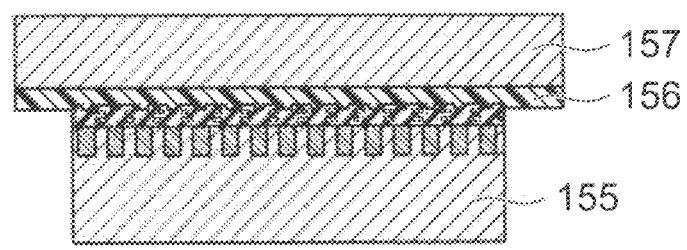
FIG. 36B
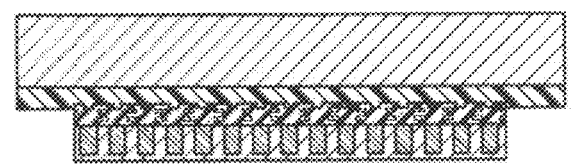
FIG. 36C
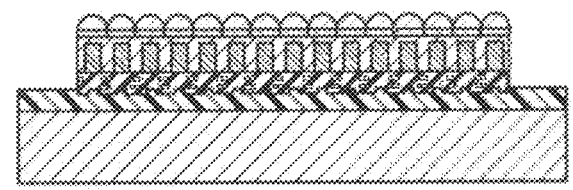
FIG. 36D
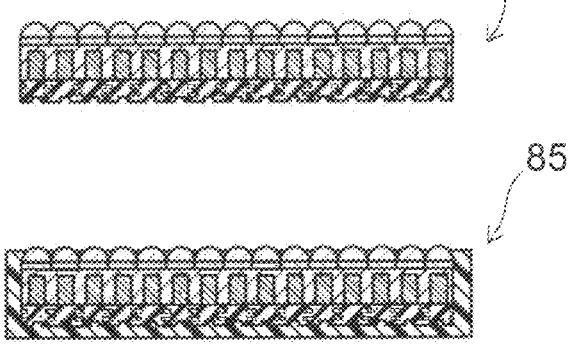
FIG. 36E
FIG. 36F

SOLID STATE IMAGING DEVICE, PORTABLE INFORMATION TERMINAL DEVICE AND METHOD FOR MANUFACTURING SOLID STATE IMAGING DEVICE

CROSS-REFERENCE TO RELATED APPLICATIONS

This application is based upon and claims the benefit of priority from the prior Japanese Patent Application No. 2011-210649, filed on Sep. 27, 2011 and Japanese Patent Application No. 2012-007150, filed on Jan. 17, 2012; the entire contents of which are incorporated herein by reference.

FIELD

Embodiments described herein relate generally to a solid state imaging device, portable information terminal device and a method for manufacturing the solid state imaging device.

BACKGROUND

A solid state imaging device in which a microlens array is configured via air gaps of several tens of μm on a sensor substrate having a plurality of pixels formed on an upper face is required to have a high degree of parallelism between the sensor substrate and the microlens array.

Accordingly, in general, the microlens array is formed directly on the upper face of the sensor substrate. This maintains parallelism between the pixels and the micro lenses.

Meanwhile, in a solid state imaging device intended to detect a distance between the solid state imaging device and a subject, a microlens array is arranged apart from a sensor substrate with pixels formed. However, if there arise variations of about several tens of μm in a gap between the sensor substrate and the microlens array in a plane parallel to the upper face of the sensor substrate, a light axis of an imaging lens and the microlenses are shifted from each other, thereby resulting in degradation of image quality. In addition, lights having passed through adjacent microlenses and having been condensed enter into the pixels to cause light color mixture and reduce the accuracy of matching among images with parallaxes.

In addition, an imaging surface of an object on a plane perpendicular to the light axis is not necessarily a plane perpendicular to the light axis, but is a curved surface generally. This phenomenon is referred to as a field curvature aberration, the position of the image of a peripheral vision is shifted and an image quality of a peripheral vision is degraded.

BRIEF DESCRIPTION OF THE DRAWINGS

FIGS. 36A to 36F are cross-sectional views illustrating a method for manufacturing a solid state imaging element according to a twenty-seventh embodiment.

DETAILED DESCRIPTION

In general, according to one embodiment, a solid state imaging device includes a sensor substrate having a plurality of pixels formed on an upper face, a microlens array substrate having a plurality of microlenses formed and a connection post with one end bonded to a region between the microlenses on the microlens array substrate and with the other end bonded to the upper face.

According to another embodiment, a portable information terminal device includes a solid state imaging device. The solid state imaging device includes a sensor substrate having a plurality of pixels formed on an upper face, a microlens array substrate having a plurality of microlenses formed and a connection post with one end bonded to a region between the microlenses on the microlens array substrate and with the other end bonded to the upper face.

According to another embodiment, a method is disclosed for manufacturing a solid state imaging device. The method can form a plurality of pixels on an upper face of a semiconductor substrate. The method can form a connection post with one end bonded to the upper face. The method can form a plurality of microlenses on a transparent substrate. The method can bond the other end of the connection post to a region between the microlenses on the transparent substrate.

Various embodiments will be described hereinafter with reference to the accompanying drawings.

First Embodiment

Embodiments of the invention will now be described with reference to the drawings.

First Embodiment

Embodiments of the invention will be described below with reference to the drawings.

First, a first embodiment will be described.

Figure 1:
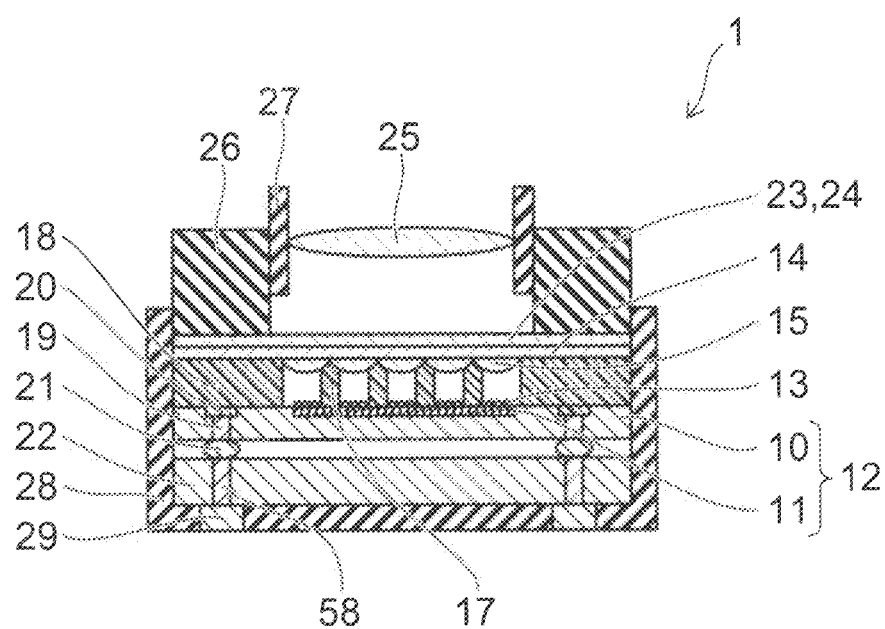
FIG. 1 is a cross-sectional view of a solid state imaging device in a first embodiment.

FIG. 1 is a cross-sectional view of a solid state imaging device in the first embodiment.

Figure 2A:
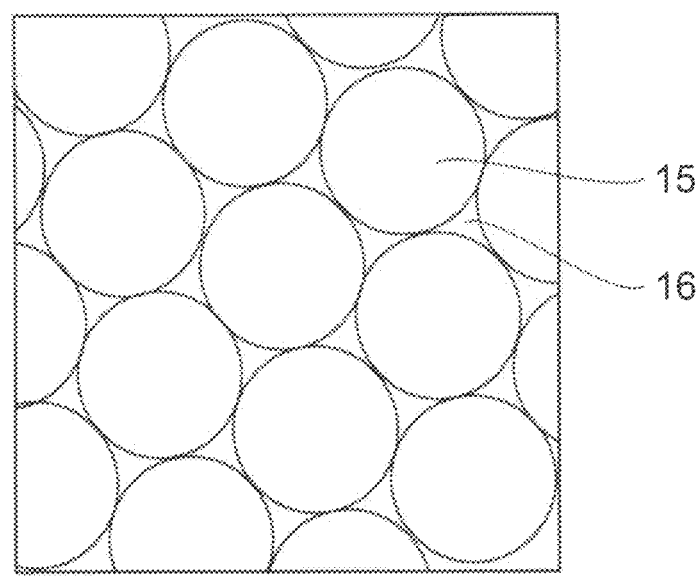
FIG. 2A is a plan view of a microlens array substrate in the first embodiment.
Figure 2B:
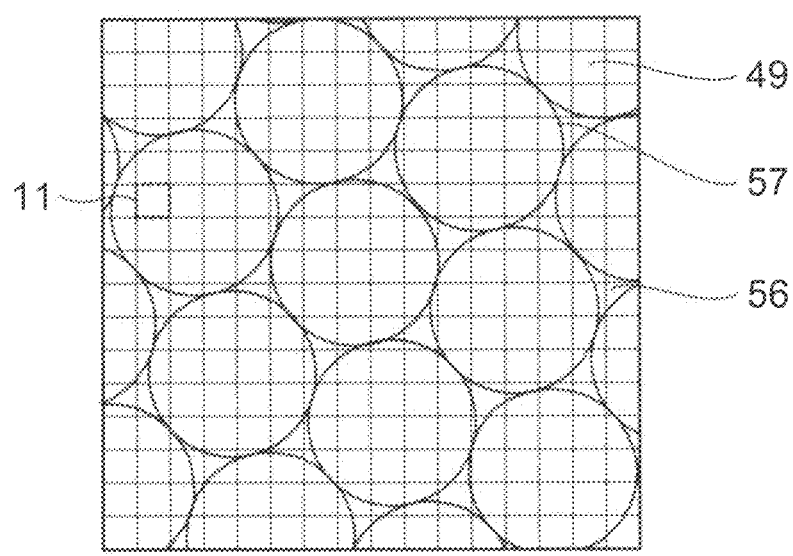
FIG. 2B is a plan view of a sensor substrate in the first embodiment.

FIG. 2A is a plan view of a microlens array substrate in the first embodiment, and FIG. 2B is a plan view of a sensor substrate in the first embodiment.

Figure 3:
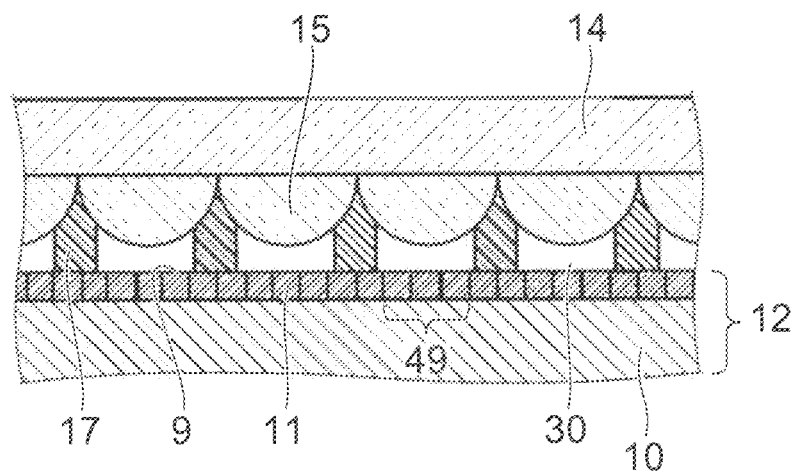
FIG. 3 is a cross-sectional view of the sensor substrate and the microlens array substrate in the first embodiment.

FIG. 3 is a cross-sectional view of the sensor substrate and the microlens array substrate in the first embodiment.

As shown in FIG. 1, a solid state imaging device 1 according to the embodiment includes a driving/processing chip 22, a sensor substrate 12, connection posts 17, a microlens array substrate 14, a visible light transmissive substrate 23, an optical filter 24, a lens holder 26, a lens tube 27, an imaging lens 25, and a light-shielding cover 28.

The driving/processing chip 22 has a plurality of penetration electrodes 58 penetrating the driving/processing chip 22. Bumps 21 are provided on the penetration electrodes 58. The sensor substrate 12 is provided on the driving/processing chip 22 so as to contact the bumps 21.

The sensor substrate 12 has penetration electrodes 19. The lower faces of the penetration electrodes 19 provided on the sensor substrate 12 are located on the bumps 21. This allows connection between the sensor substrate 12 and the driving/processing chip 22. The upper faces of the penetration electrodes 19 are connected to electrode pads 20. The electrode pads 20 are used for reading pixels 11.

The sensor substrate 12 has a plurality of pixels 11, for example, photodiodes, on a semiconductor substrate 10, for example, a silicon substrate. A plurality of pixels 11 are provided in an array on an upper face 9 of the sensor substrate 12.

Pixel condensing microlenses 13 are provided on the pixels 11.

Ends of a plurality of connection posts 17 are bonded to the upper face 9 of the sensor substrate 12. The microlens array substrate 14 is bonded to the other ends of a plurality of connection posts 17. The microlens array substrate 14 is formed by using a transparent substrate, for example, a quartz plate. The microlens array substrate 14 has a plurality of microlenses 15 on one face. The microlens array substrate 14 is positioned such that the face of the microlens array substrate 14, having the microlenses 15 formed faces the upper face 9 of the sensor substrate 12.

A surrounding part of the pixels 11 in the sensor substrate 12 and a surrounding part of the microlenses 15 in the microlens array substrate 14 are fixed to each other by spacer resin 18.

The microlens array substrate 14 has the visible light transmissive substrate 23 and the optical filter 24 on a face opposite to the sensor substrate 12. The imaging lens 25 is provided on the visible light transmissive substrate 23 and the optical filter 24. The imaging lens 25 is positioned such that a light axis pass through a region of the microlens array substrate 14 with the microlenses 15 and a region of the sensor substrate 12 with the pixels 11. End edges of the imaging lens 25 are supported by the lens tube 27. The lens tube 27 is attached to the lens holder 26 and fixed on the surrounding part of the microlens array substrate 14. The light-shielding cover 28 is provided to cover a bottom face of the processing/driving chip and side faces of the processing/driving chip 22, the sensor substrate 12, the spacer resin 18, the microlens array substrate 14, the visible light transmissive substrate 23, the optical filter 24, and the lens holder 26. The light-shielding cover 28 has module electrodes 29 penetrating a bottom thereof. The module electrodes 29 are connected to the penetration electrodes 58 of the driving/processing chip 22.

As shown in FIG. 2A, the microlenses 15 have a circular form when one surface of the microlens array substrate 14 is seen from a vertical direction. The microlenses 15 are arranged two-dimensionally on the one face of the microlens array substrate 14. For example, the microlenses 15 are arranged in a hexagonal close-packed manner, that is, in a manner that each one of the microlenses 15 is surrounded by six microlenses 15 and is in contact with the six microlenses.

One microlens 15 is larger in size than one pixel 11. When the circle of the microlens is compared in size with the circle of the pixel 11, the circle of the microlens 15 accommodates entirely six pixels 11 and partially 16 pixels 11.

As shown in FIG. 2B, since the microlenses 15 have a circular form as seen from a direction of light incidence, regions 57 irradiated with lights condensed by passing through the microlenses 15 have a circular form, on the upper face 9 of the sensor substrate 12. Clusters of the pixels 11 arranged within the regions 57 are defined as pixel blocks 49. Each of the pixel blocks 49 corresponds to each of the microlenses 15.

On the upper face 9 of the sensor substrate 12, there is a region 56 not being irradiated with lights condensed by passing through the microlenses 15. That is, lights condensed by passing through the microlenses 15 do not enter into the pixels 11 arranged in the region 56.

First ends of the connection post 17 are bonded to region 16 between the microlenses 15 on the microlens array substrate 14. Second ends of the connection posts 17 are bonded to the region 56 on the upper face 9 of the sensor substrate 12.

As shown in FIG. 3, the sensor substrate 12 and the microlens array substrate 14 are connected together and are supported by the connection posts 17. In addition, the upper face 9 of the sensor substrate 12 and one face of the microlens array substrate 14 are held in parallel by the connection posts 17.

The connection posts 17 include a heat-soluble organic material, for example. In addition, the connection posts 17 include a material absorbing light in a visible wavelength range, for example, a black pigment. The black pigment contains one or more kinds of pigments selected from the group consisting of carbon black, pigment black 7, and titanium black, for example.

A distance between the sensor substrate 12 and the microlens array substrate 14 is preferably 10 to 100 micrometers.

Spaces between the connection posts 17 between the upper face 9 of the sensor substrate 12 and the microlens array substrate 14 are air gaps 30, that is, gaps in which a gas exists.

Next, an operation of the solid state imaging device 1 according to the embodiment will be described.

Lights from a subject are condensed by passing through the imaging lens 25, and enter into the microlens array substrate 14. Among the lights having entered the microlens array substrate 14, lights having reached the microlenses 15 pass through the respective microlenses 15 and are condensed for the respective microlenses 15, and then images are formed for the respective microlenses 15 on the upper face 9 of the sensor substrate 12. That is, images of the subject are formed for the respective pixel blocks 49 corresponding to the microlenses 15. However, the view points of these images are different little by little due to differences in the positions of the microlenses 15. These images are sensed by a plurality of pixels 11 belonging to the pixel blocks 49. In this manner, a plurality of images are obtained with parallaxes therebetween by the number of the microlenses 15.

Then, by performing image processing on a group of images with parallaxes obtained from a large number of microlenses 15, a distance between the subject and the solid state imaging device 1 is estimated based on the principle of triangulation. In addition, by performing image processing for connection, one two-dimensional image is obtained.

The connection posts 17 provided in the region 16 between the microlenses 15 prevent the pixel blocks 49 associated with other adjacent microlenses 15 from being irradiated with a light having passed through one of microlenses 15.

Next, an advantage of the solid state imaging device 1 according to the embodiment will be described.

If the microlens array substrate 14 and the sensor substrate 12 are not held in parallel, the light axis may shift and bring about degradation in image quality. In the solid state imaging device 1 according to the embodiment, the microlens array substrate 14 and the sensor substrate 12 can be held in parallel because the microlens array substrate 14 and the sensor substrate 12 are fixed together by the connection posts 17. This allows high image quality at the solid state imaging device 1.

The connection posts 17 are provided in the region 16 between the microlenses 15 on the microlens array substrate 14. In addition, the connection posts 17 are provided in the region 56 where lights condensed by passing through the microlenses 15 on the sensor substrate 12 do not enter. The region 56 is a so-called dead space making no contribution to capturing images, and thus does not decrease the number of effective pixels. Accordingly, it is not necessary to provide any extra region for the connection posts 17, which enhances the density of the microlenses 15 on the microlens array substrate 14 and the density of the pixels 11 on the sensor substrate 12. Accordingly, it is possible to realize high image quality in the solid state imaging device 1.

The connection posts 17 include a material absorbing lights in a visible wavelength range. Accordingly, the pixel blocks 49 do not receive lights condensed by passing through the microlenses 15 except for the microlenses 15 associated with the pixel blocks 49. Therefore, it is possible to prevent color mixture.

Second Embodiment

Next, a second embodiment will be described.

This embodiment is a method for manufacturing a solid state imaging device.

FIGS. 4A to 4D are process cross-sectional views illustrating a method for manufacturing a solid state imaging device according to the second embodiment.

Figure 4A:
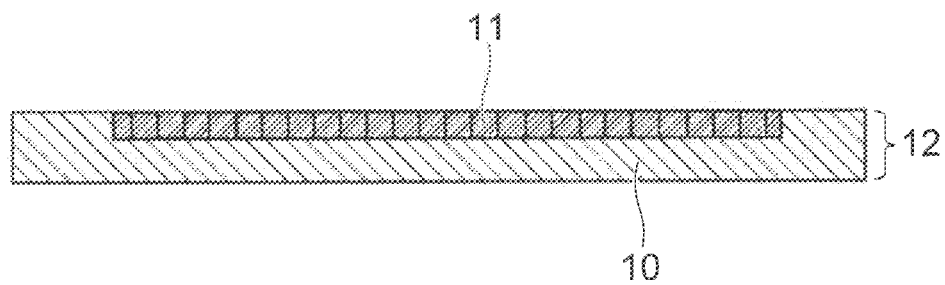
FIGS. 4A to 4D are process cross-sectional views illustrating a method for manufacturing a solid state imaging device according to a second embodiment.

First, as shown in FIG. 4A, the pixels 11 and a peripheral circuit (not shown) are formed on the upper face of the semiconductor substrate 10, for example, a silicon substrate. The pixels 11 are photodiodes, for example. The pixels 11 and the peripheral circuit are formed using a manufacturing process for CMOS (Complementary Metal Oxide Semiconductor), for example. Accordingly, the sensor substrate 12 is fabricated.

Figure 4B:
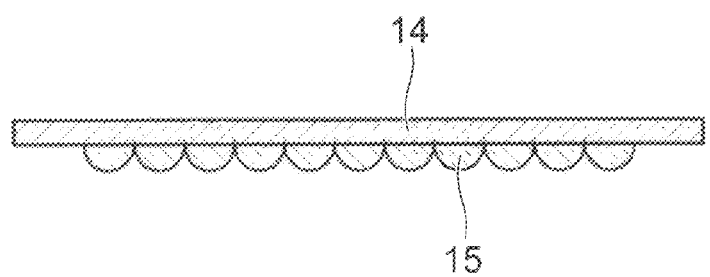

Meanwhile, as shown in FIG. 4B, a transparent substrate, for example, a quartz plate, is prepared as a material for the microlens array substrate 14. In addition, by dry-etching the transparent substrate, the microlenses 15 is formed on the transparent substrate.

Figure 4C:
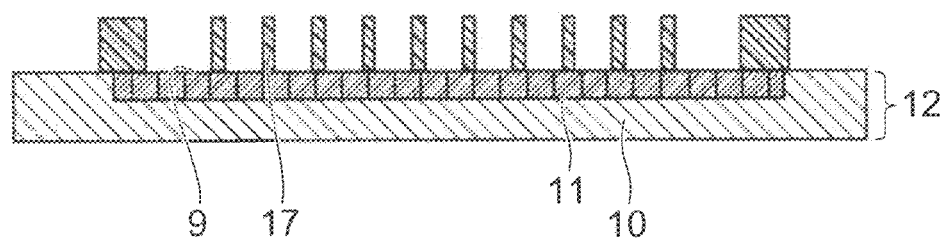

In this manner, the microlens array substrate 14 having a plurality of microlenses 15 formed is fabricated. In addition, as shown in FIG. 4C, the connection posts 17 are formed in regions intended to be the region 56 on the upper face 9 of the sensor substrate 12 (refer to FIG. 2), that is, regions not irradiated with lights having passed through the microlenses 15 if the microlens array substrate 14 is bonded to the sensor substrate 12.

The connection posts 17 are formed by depositing a heat-soluble organic material on the sensor substrate 12 and then patterning the same by lithography. Accordingly, the connected posts 17 are formed with first ends thereof bonded to the upper face 9 of the sensor substrate 12. The connection posts 17 include a material that absorbs lights in the visible wavelength range.

Figure 4D:
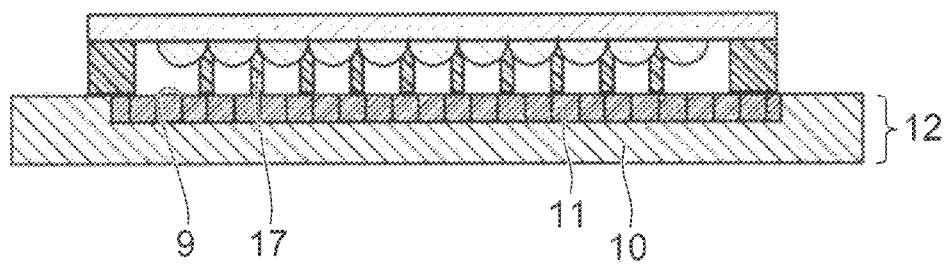

After that, as shown in FIG. 4D, second ends of the connection posts 17 are bonded to the region 16 between the microlenses 15 on the microlens array substrate 14 (refer to FIG. 2A).

Accordingly, the structure shown in FIG. 3 is manufactured.

Furthermore, the penetration electrodes 19 are formed on the sensor substrate 12. In addition, the electrode pads 20 for reading the pixels 11 are formed on the upper face of the penetration electrodes 19. In addition, lower faces of the penetration electrodes 19 are connected to the bumps 21. Next, the bumps 21 and the penetration electrodes 58 on the driving/processing chip 22 are bonded together. The visible light transmissive substrate 23 and the optical filter 24 are provided on the microlens array substrate 14.

In addition, the lens holder 26 is arranged in a region without the pixels 11 on a side of the microlens array substrate 14 opposite to the sensor substrate 12. The lens tube 27 with ends of the imaging lens 25 fixed is attached to the lens holder 26. At this time, a light axis of the imaging lens 25 passes through the microlens array substrate 14 and the sensor substrate 12. After that, the light-shielding cover 28 for blocking unwanted light is attached so as to cover the driving/processing chip 22, the sensor substrate 12, the microlens array substrate 14, and the lens holder 26. Then, the module electrodes 29 are attached to a bottom portion of the light-shielding cover 28.

Accordingly, the solid state imaging device 1 shown in FIG. 1 is manufactured.

In addition, the microlenses 15 can be formed by gluing a microlens sheet made of a transparent organic film to a transparent substrate. Alternatively, the microlenses 15 can be formed by imprinting a microlens sheet made of a transparent organic film.

Next, an advantage of the embodiment will be described below.

According to a method for manufacturing the solid state imaging device 1 according to the embodiment, first ends of the connection post 17 on the microlens array substrate 14 side reside in the region 16 between the microlenses 15. The region 16 form concave portions in the microlens array substrate 14. This allows the connection posts 17 to be bonded in a self-aligning manner. Accordingly, it is possible to realize two-dimensional arrangement of the connection posts 17 with a high degree of accuracy.

Third Embodiment

Next, a third embodiment will be described below.

FIGS. 5A to 5E are process cross-sectional views illustrating a method for manufacturing a solid state imaging device according to a third embodiment.

Figure 5A:
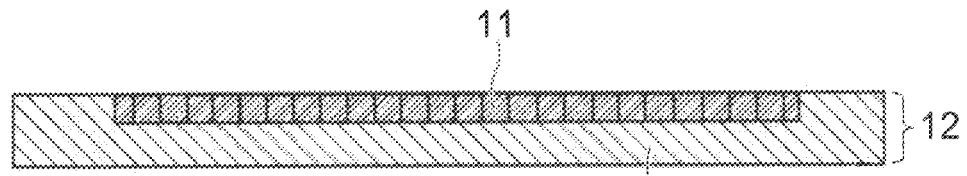
FIGS. 5A to 5E are process cross-sectional views illustrating a method for manufacturing a solid state imaging device according to a third embodiment.
Figure 5B:

First, as shown in FIGS. 5A and 5B, the processes shown in FIGS. 4A and 4B in the foregoing second embodiment are performed. Descriptions on these processes are omitted here.

Figure 5C:
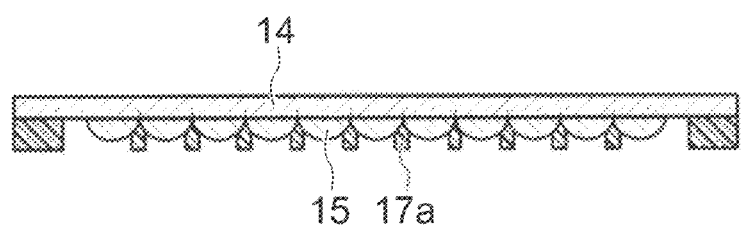

Next, as shown in FIG. 5C, first connection posts 17a are formed in the region 16 between the microlenses 15 on the microlens array substrate 14. The first connection posts 17a are formed by depositing a thermal-soluble organic material on the microlens array substrate 14 and patterning the same by lithography. The first connection posts 17a include a material absorbing light in a visible wavelength range.

Figure 5D:
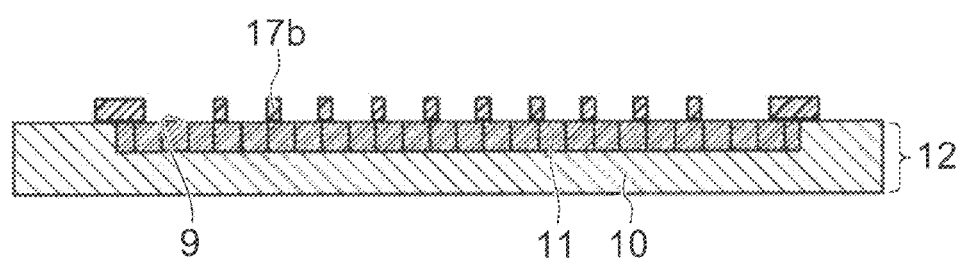

Meanwhile, as shown in FIG. 5D, second connection posts 17b are formed in the region 56 on the upper face 9 of the sensor substrate 12. The second connection posts 17b are formed by the foregoing processes shown in FIG. 4C.

Figure 5E:
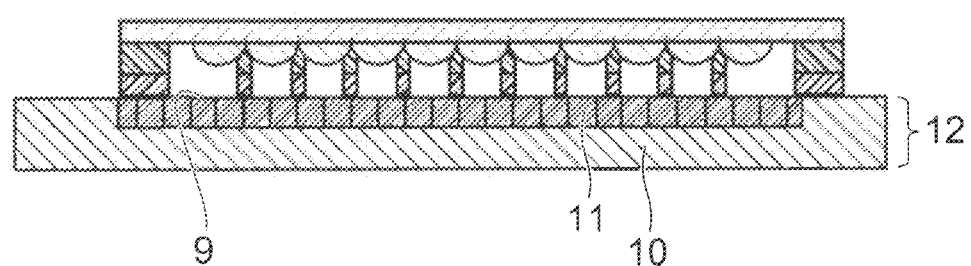

In addition, as shown in FIG. 5E, second ends of the first connection posts 17a formed on the microlens array substrate 14 are bonded to second ends of the second connection posts 17b formed on the sensor substrate 12.

Accordingly, the solid state imaging device 1 shown in FIG. 3 is manufactured.

Next, an advantage of the embodiment will be described.

According to the method for manufacturing the solid state imaging device 1 according to the embodiment, the first and second connection posts are formed in advance by lithography on both the sensor substrate 12 and the microlens array substrate 14. Accordingly, the manufacturing method including bonding the connection posts 17 at first ends or second ends by gluing, for example, makes it possible to determine a bonding position with a high degree of accuracy.

Fourth Embodiment

Next, a fourth embodiment will be described.

Figure 6A:
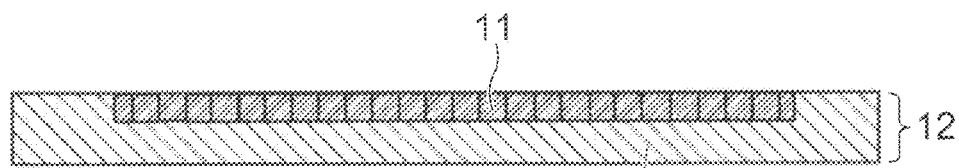
FIGS. 6A to 6E are process cross-sectional views illustrating a method for manufacturing a solid state imaging device in a fourth embodiment.
Figure 6B:
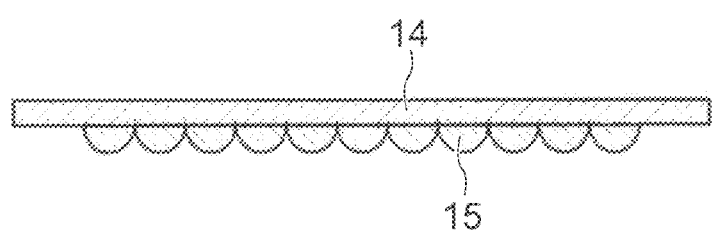

FIGS. 6A to 6B are process cross-sectional views illustrating a method for manufacturing a solid state imaging device in the fourth embodiment.

First, as shown in FIGS. 6A and 6B, the foregoing processes shown in FIGS. 5A and 5B in the third embodiment will be performed. Descriptions on these processes are omitted here.

Figure 6C:
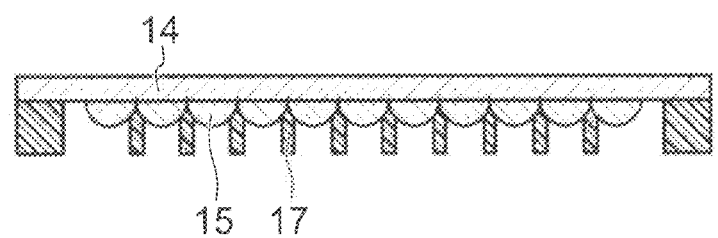

Next, as shown in FIG. 6C, the foregoing process shown in FIG. 5C in the third embodiment is performed. Description on this process is omitted here.

Figure 6D:
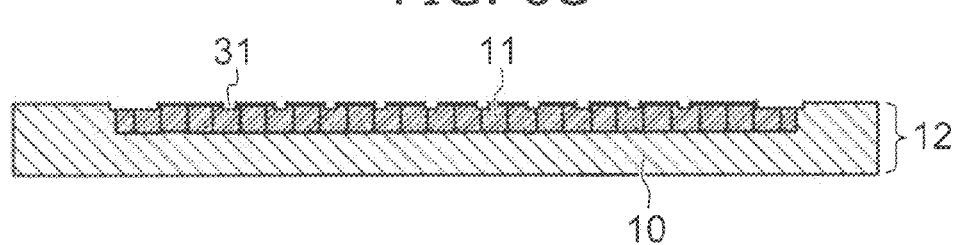

Meanwhile, as shown in FIG. 6D, concave portions 31 are formed on the upper face of the sensor substrate 12. The concave portions 31 are formed by etching, for example. The position of the concave portions 31 are aligned with the position of the connection posts 17 formed on the microlens array substrate 14. The width of the concave portion 31 is aligned with the width of the connection posts 17.

Figure 6E:
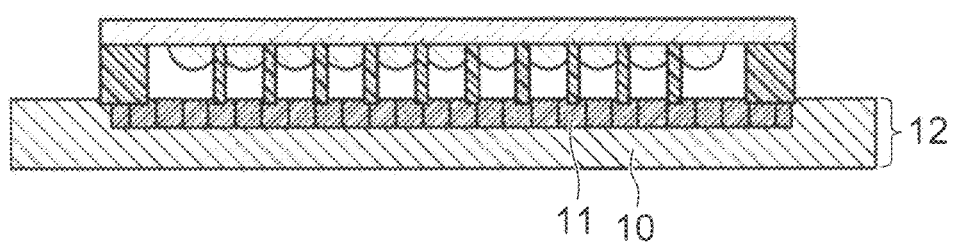

In addition, as shown in FIG. 6E, the second ends of the connection posts 17 are fitted into the concave portions 31.

Accordingly, the solid state imaging device 1 shown in FIG. 3 is manufactured.

Next, an advantage of the embodiment will be described.

According to the solid state imaging device according to the embodiment, it is possible to adjust depth of the second ends of the connection posts 17 to be fitted into the concave portions 31. Accordingly, it is possible to adjust the degree of parallelism between the sensor substrate 12 and the microlens array substrate 14. In addition, fitting the connection posts 17 into the concave portions 31 increases bond strength.

Fifth Embodiment

Next, a fifth embodiment will be described.

Figure 7:
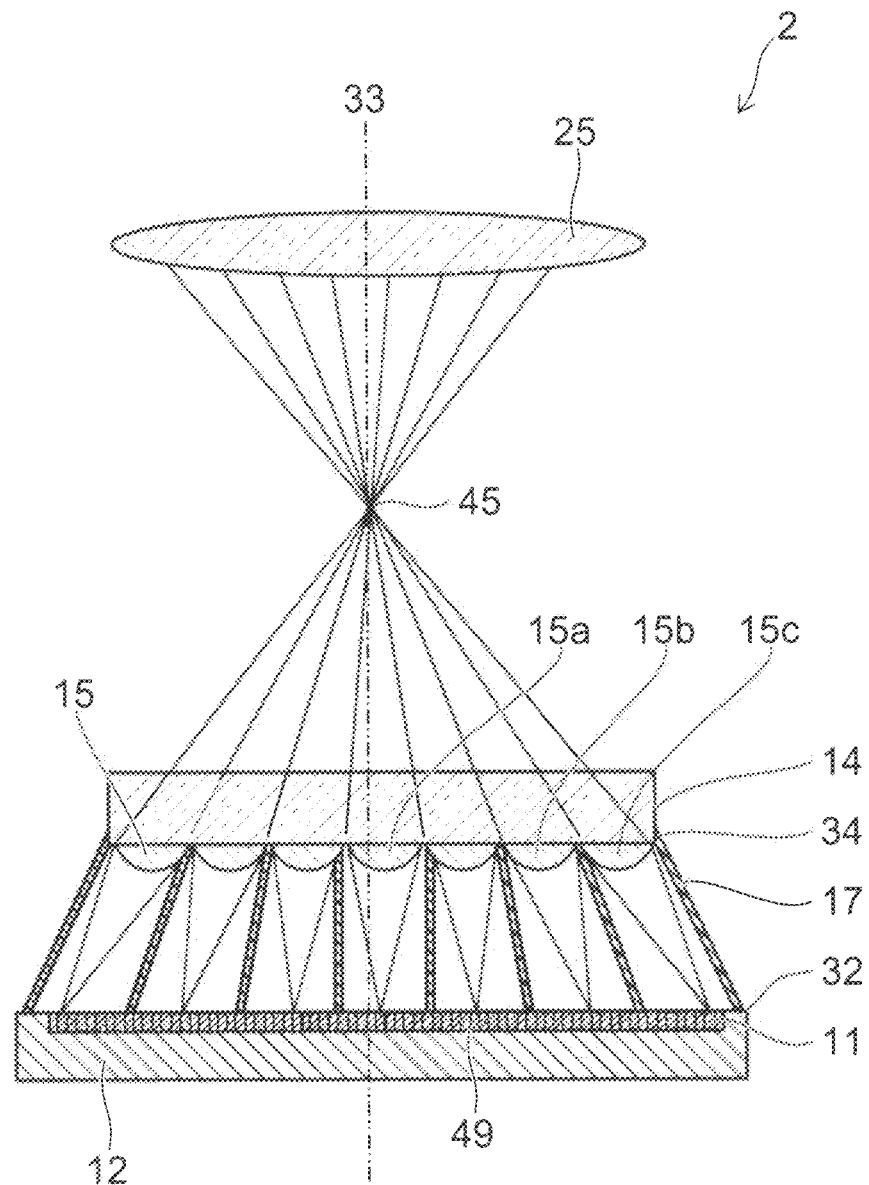
FIG. 7 is a cross-sectional view illustrating a solid state imaging device in a fifth embodiment.

FIG. 7 is a cross-sectional view illustrating a solid state imaging device in a fifth embodiment.

As shown in FIG. 7, in the solid state imaging device 2 according to the embodiment, a focal point 45 of the imaging lens is located on the imaging lens 25 side of the microlens array substrate 14. In addition, lights from the subject are condensed on the focal point 45 by passing through the imaging lens 25. The lights from the focal point 45 spread out into the microlens array substrate 14. The lights from the subject enter into the microlenses 15a close to the light axis 33 from a direction almost vertical to the faces of the microlenses 15a. Then, the lights condensed by passing through the microlenses 15a reach the pixel blocks 49 in a direction almost vertical to the upper face 9 of the sensor substrate 12.

Meanwhile, the lights from the subject enter the microlenses 15b distant from the light axis 33 at the surrounding part of the microlens array substrate 14 at an angle largely inclined from the angle vertical to the faces of the microlenses 15b. Then, the lights condensed by passing through the microlenses 15b reach the pixel blocks 49 at an angle largely inclined from the angle vertical to the upper face of the sensor substrate 12.

The connection posts 17 are provided by being inclined so as to be suited to the angle of the lights condensed by passing through the microlenses 15 with respect to the upper face of the sensor substrate 12. Therefore, the connection posts 17 are inclined such that second ends 34 of the connection posts 17 is directed toward the light axis 33 as the distance between first ends 32 connected to the sensor substrate 12 and the light axis 33 of the imaging lens 25 becomes larger. In addition, an angle formed by a direction of the light axis 33 of the imaging lens 25 and a direction in which the connection posts 17 extend becomes larger as the distance between the first ends 32 connected to the sensor substrate 12 and the light axis 33 becomes larger.

Arrangements and operations of the embodiment other than those described above are the same as those in the first embodiment.

Next, an advantage of the embodiment will be described.

In the solid state imaging device 2 according to the embodiment, lights condensed by passing through the microlenses 15 are inclined with respect to the upper face of the sensor substrate 12 in accordance with the distance from the light axis 33.

According to the solid state imaging device 2 according to the embodiment, the connection posts 17 are provided so as to be suited to the inclination of the lights condensed by passing through the microlenses 15. Accordingly, the connection posts 17 do not prevent the lights condensed by passing through the microlenses 15 from forming images on the pixel blocks 49 associated with the microlenses 15.

In addition, the connection posts 17 prevent the lights condensed by passing through the microlenses 15b at a surrounding part of the microlens array substrate 14 from forming images on the pixel blocks 49 associated with the microlens 15c adjacent to the microlens 15b. This does not cause color mixture, thereby allowing realizing high picture quality of the solid state imaging device 2.

Sixth Embodiment

Next, a sixth embodiment will be described.

The embodiment is a method for manufacturing the foregoing solid state imaging device 2.

FIGS. 8A to 8F and 9A to 9F are process cross-sectional views illustrating a method for manufacturing the solid state imaging device according to a sixth embodiment.

Figure 8A:
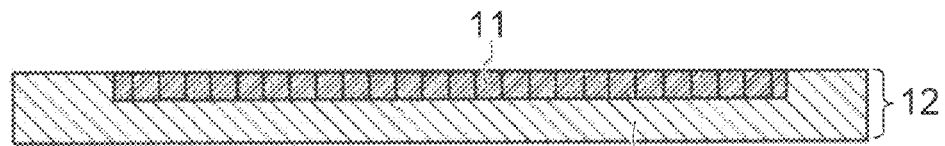
FIGS. 8A to 8F and 9A to 9F are process cross-sectional views illustrating a method for manufacturing the solid state imaging device according to a sixth embodiment.
Figure 8B:
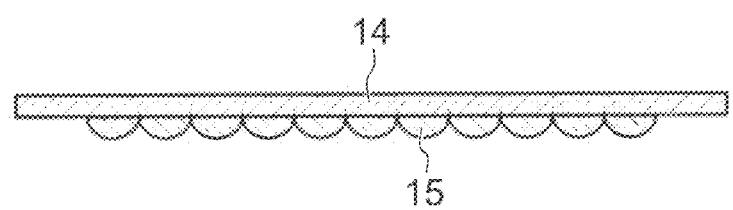

First, as shown in FIGS. 8A and 8B, the processes shown in FIGS. 4A and 4B in the foregoing second embodiment are performed. Descriptions on these processes are omitted here.

Figure 8C:
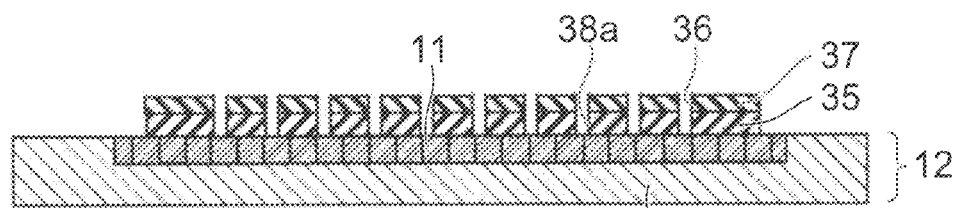

Next, as shown in FIG. 8C, a sacrifice layer 35 is formed on the sensor substrate 12. After that, the sacrifice layer 35 is patterned. The patterning is carried out by forming a mask 37 with openings 36 on the sacrifice layer 35 and etching the sacrifice layer 35 with the mask 37 as a mask. The sacrifice layer 35 has concave portions 38a vertical to the upper face of the sensor substrate 12.

Figure 8D:
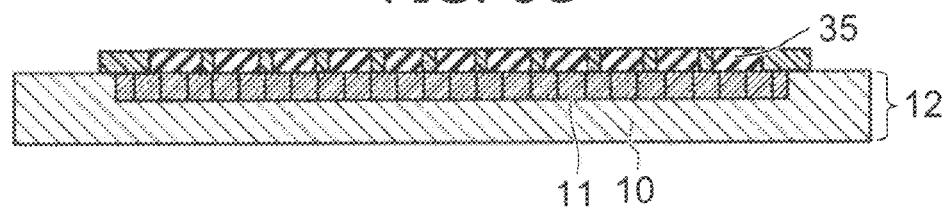

After that, as shown in FIG. 8D, the mask 37 is removed and a material for the connection posts 17 is embedded into the concave portions 38a.

Figure 8E:
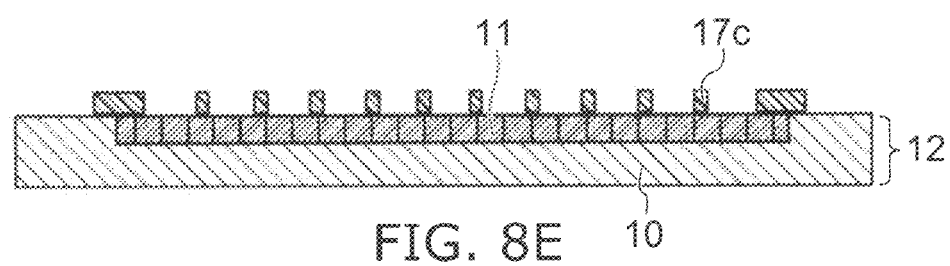

Then, as shown in FIG. 8E, the sacrifice layer 35 is removed with the embedded material for the connection posts 17 left. Accordingly, connection posts 17c are formed with first ends bonded to the sensor substrate 12.

Figure 8F:
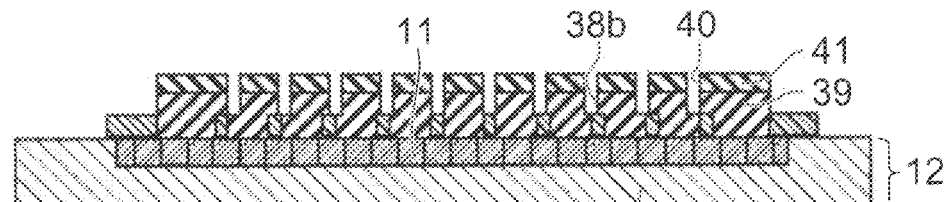

Next, as shown in FIG. 8F, a sacrifice layer 39 is formed on the sensor substrate 12 and the connection posts 17c. After that, the sacrifice layer 39 is patterned. The patterning is performed by forming a mask 41 with openings 40 on the sacrifice layer 39 and etching the sacrifice layer 39 with the mask 41 as a mask. The positions of the openings 40 are shifted from the positions of the openings 36. Specifically, the masks 37 and 41 are formed such that the openings 36 and 40 overlap partially when the masks 37 and 41 are stuck to each other. The etching also forms concave portions 38b vertical to the upper face of the sensor substrate 12 in the sacrifice layer 39. The concave portions 38a and the concave portions 38b are shifted in position from each other but are partially connected to each other. Accordingly, the concave portions are inclined as a whole.

Figure 9A:
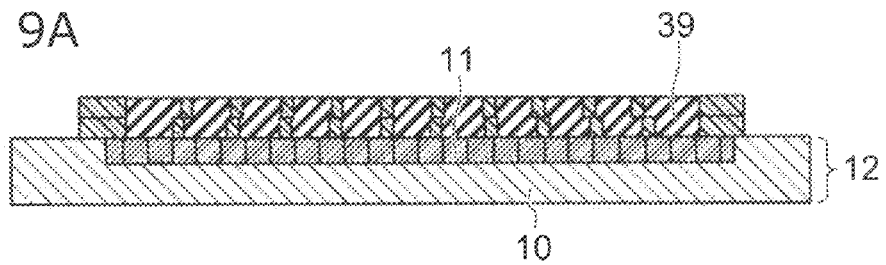

After that, as shown in FIG. 9A, the mask 41 is removed and a material for the connection posts 17 is embedded into the concave portions 38b.

Figure 9B:
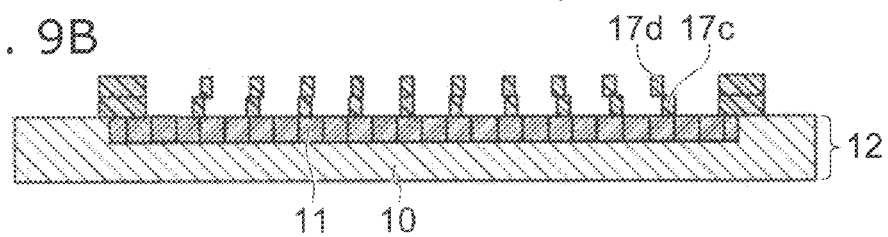

Then, as shown in FIG. 9B, the sacrifice layer 39 is removed with the embedded material for the connection posts 17 left. Accordingly, connection posts 17d are formed with first ends connected to second ends of the connection posts 17c. The connection posts 17c and the connection posts 17d are inclined as a whole.

Figure 9C:
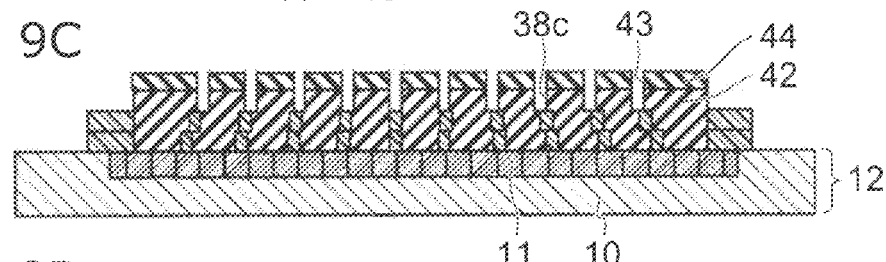

Next, as shown in FIG. 9C, a sacrifice layer 42 is formed on the sensor substrate 12 and the connection posts 17c and 17d. After that, the sacrifice layer 42 is patterned. The patterning is performed by forming a mask 44 with openings 43 on the sacrifice layer 42 and etching the sacrifice layer 42 with the mask 44 as a mask. Like in the foregoing case of FIG. 8F, the openings 40 and 43 are formed by being shifted in position from each other. The etching also forms concave portions 38c vertical to the upper face 9 of the sensor substrate 12 in the sacrifice layer 42. Since the concave portions 38b and the concave portions 38c are shifted in position from each other but are partially connected to each other, the concave portions are inclined as a whole.

Figure 9D:
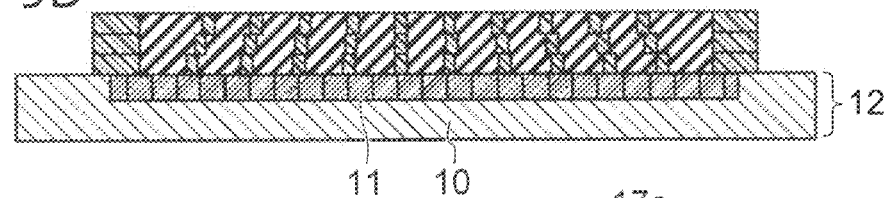

After that, as shown in FIG. 9D, the mask 44 is removed and a material for the connection posts 17 is embedded into the concave portions 38c.

Figure 9E:
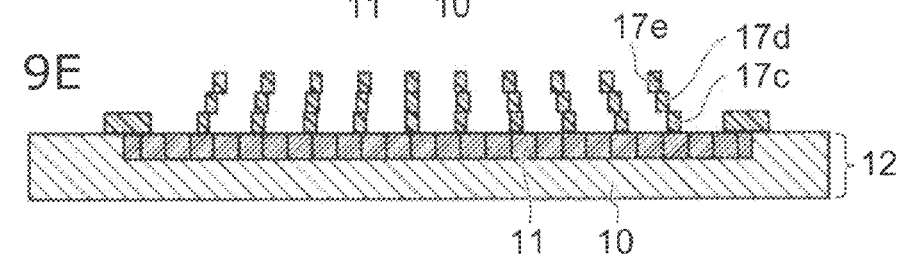

Then, as shown in FIG. 9E, the sacrifice layer 42 is removed with the embedded material for the connection posts 17 left. Accordingly, connection posts 17e are formed with first ends connected to second ends of the connection posts 17d.

The connection posts 17c, 17d, and 17e form the inclined connection posts 17.

It is possible to make seams on side faces of the inclined connection posts 17 less stand-out by increasing the number of formations of sacrifice layers and forming connection posts with a fine pitch.

Figure 9F:
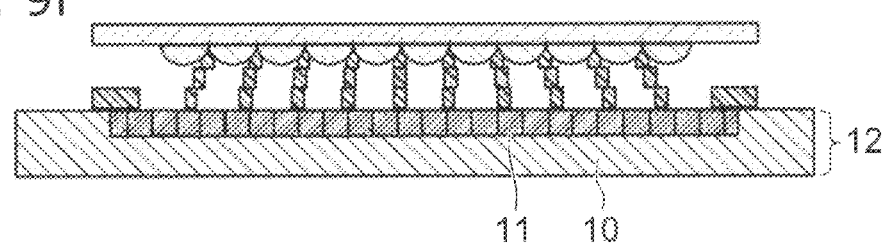

Next, as shown in FIG. 9F, the process shown in FIG. 4D in the foregoing second embodiment is performed. Description on this process is omitted here.

Accordingly, the solid state imaging device 2 shown in FIG. 7 is manufactured.

Next, an advantage of the embodiment will be described.

The inclined connection posts 17 can be formed by the method for manufacturing the solid state imaging device 2 in the embodiment. Accordingly, it is possible to prevent color mixture and realize high picture quality in the solid state imaging device 2.

Seventh Embodiment

Next, a seventh embodiment will be described.

Figure 10:
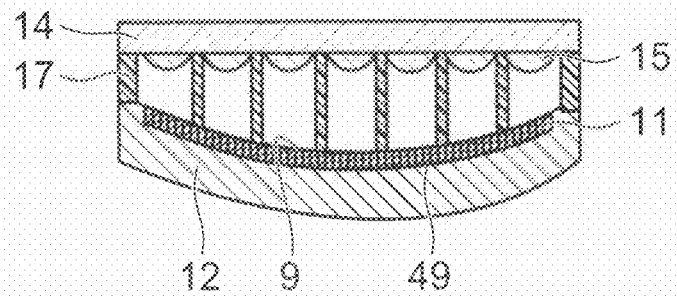
FIG. 10 is a cross-sectional view illustrating a solid state imaging device according to a seventh embodiment.

FIG. 10 is a cross-sectional view illustrating a solid state imaging device according to the seventh embodiment.

As shown in FIG. 10, in a solid state imaging device 3 according to the embodiment, the sensor substrate 12 is curved such that the upper face 9 is recessed. Meanwhile, the microlens array substrate 14 is made flat and provided so as to face the upper face 9 of the sensor substrate 12. The connection posts 17 are vertically bonded to the microlens array substrate 14. Therefore, the connection posts 17 connected to a center of the upper face 9 of the sensor substrate 12 is made larger than the connection posts 17 connected around the upper face 9 of the sensor substrate 12.

The imaging lens 25 may be provided on a side of the microlens array substrate 14 opposite to the sensor substrate 12. Further, the connection posts 17 may be inclined as in the foregoing solid state imaging device 2.

In addition, the sensor substrate 12 may be curved such that distances from the focal point 45 of the imaging lens 25 to the pixels 11 are equal to each other.

Next, an operation of the solid state imaging device 3 according to the embodiment will be described.

In the solid state imaging device 3 according to the embodiment, there is a smaller difference between length of a light path in the case where lights from the subject are condensed by passing through a surrounding part of the imaging lens 25 and a surrounding part of the microlens substrate 14 and then are imaged on the pixel blocks 49, and length of a light path in the case where lights from the subject are condensed by passing through a central part of the imaging lens 25 and a central part of the microlens array substrate 14 and then are imaged on the pixel blocks 49.

Next, an advantage of the embodiment will be described.

According to the solid state imaging device 3 according to the embodiment, the sensor substrate 12 is curved and therefore the microlenses 15 allows lights from the subject condensed by passing through the imaging lens 25 to reach evenly a central region and a surrounding region of the upper face 9 of the sensor substrate 12. Accordingly, it is possible to suppress field curvature and realize high picture quality of the solid state imaging device 3.

Modification Example of Seventh Embodiment

Figure 11:
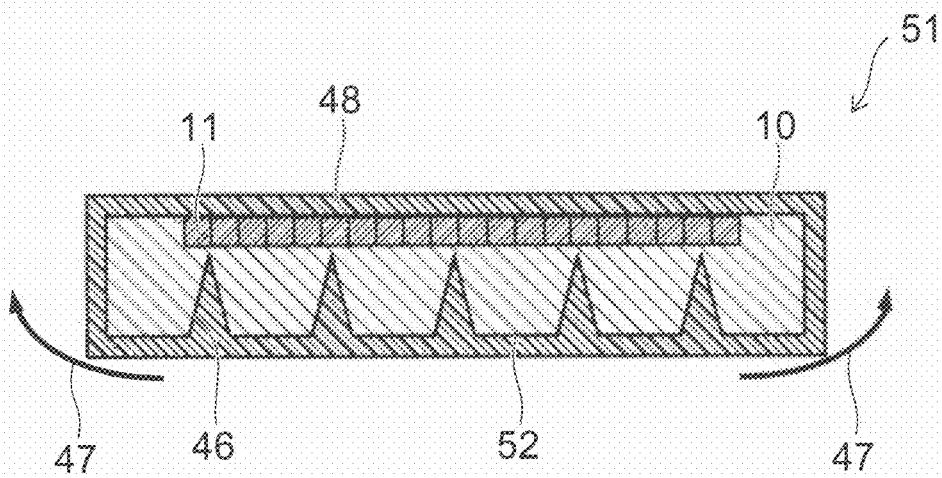
FIG. 11 is a cross-sectional view illustrating a sensor substrate in a modification example of the seventh embodiment.

FIG. 11 is a cross-sectional view illustrating a sensor substrate in a modification example of the seventh embodiment.

Figure 12A:
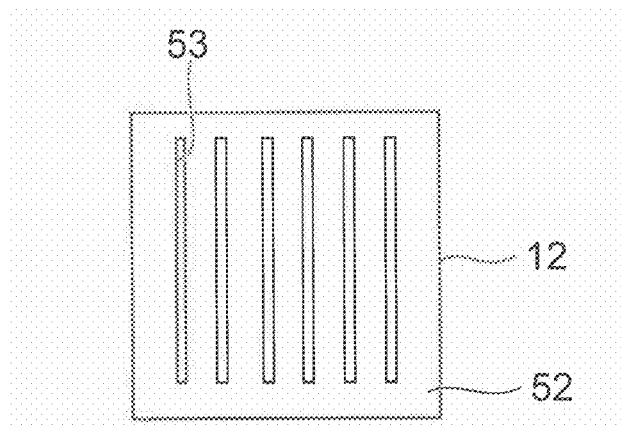
FIGS. 12A to 12C are plan views illustrating the sensor substrate in the modification example of the seventh embodiment.
Figure 12B:
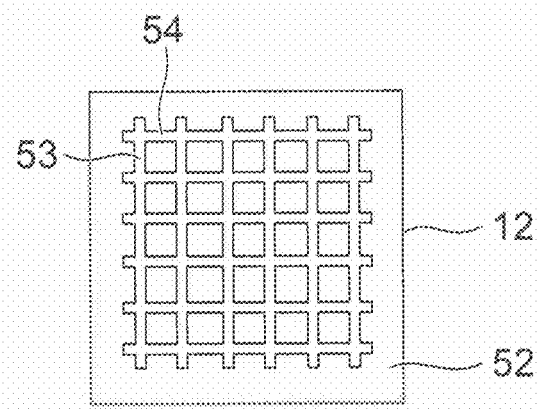
Figure 12C:
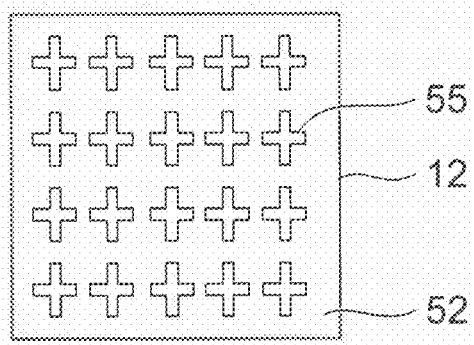

FIGS. 12A to 12C are plan views illustrating the sensor substrate in the modification example of the seventh embodiment.

As shown in FIG. 11, the sensor substrate 51 can be curved by making the sensor substrate 51 thin. The thickness of the sensor substrate 51 is preferably 5 to 10 micrometers.

In the case of a semiconductor crystal that is likely to be cleaved such as silicon, the sensor substrate 51 may be broken without being curved depending on crystal orientation even if the sensor substrate 51 is made thin. Therefore, notches 46 are formed in a back surface 52 of the sensor substrate 51 opposite to the upper face 9. This allows the surrounding part of the sensor substrate 51 to be easily curved in an upward direction 47 such that the upper face 9 is recessed. The notches 46 can be formed by patterning an arbitrary shape on the back surface of the sensor substrate 51 by lithography, for example, and etching the same.

Furthermore, as a measure for preventing breakage of the sensor substrate 51, the sensor substrate 51 is coated with an organic film 48. As the organic film 48, the one passing lights in a visible wavelength range therethrough is used. For example, parylene (paraxylene polymer) is formed by deposition polymerization or the like so as to cover the sensor substrate 51. Parylene is an extremely chemically stable substance which is inactive against various solvents and medicals, and has a low dielectric constant and electrical insulation properties, and is excellent in mechanical properties and light transmission properties. Here, as parylene that covers the sensor substrate 51, parylene C, parylene N, or the like, for example, can be used.

As shown in FIG. 12A, a plurality of notches 53 extending in one direction on the back surface of the sensor substrate 51 are formed on the back surface 52 of the sensor substrate 51.

In addition, as shown in FIG. 12B, in addition to the notches 53, a plurality of notches 54 extending in a direction intersecting with the direction in which the notches 53 extend, are formed on the back surface 52 of the sensor substrate 51.

Furthermore, as shown in FIG. 12C, a plurality of crosslike notches 55 which cross one direction and another direction intersecting with the one direction on the back surface 52, are arranged in a matrix in the one direction and the other direction, on the back surface 52 of the sensor substrate 51.

Next, an advantage of the modification example will be described.

The use of the sensor substrate 51 in the modification example makes it possible to provide the solid state imaging device 3 that is unlikely to be broken even if the sensor substrate 51 is curved such that the upper face 9 is recessed.

Coating the sensor substrate 51 with an organic film makes it possible to provide the solid state imaging device 3 having water resistance, chemical resistance, gas impermeability, electrical insulation property, and heat resistance.

Furthermore, the organic film is made of parylene having a high coating property. Accordingly, the sensor substrate 51 can be evenly coated. In addition, coating the sensor substrate 51 with parylene makes it possible to improve resistance of the sensor substrate 51 against various solvents and chemicals.

Furthermore, this enhances the sensor substrate 51 in insulation property and mechanical strength. Moreover, the sensor substrate 51 can pass sufficient lights in a visible wavelength range therethrough even if the sensor substrate 51 is coated with parylene.

In addition, forming the notches 53, 54, and 55 on the back surface 52 of the sensor substrate 12 makes the sensor substrate prone to be curved without being broken.

Advantages of the modification example other than the foregoing ones are the same as those described above of the seventh embodiment.

Eighth Embodiment

Next, an eighth embodiment will be described below.

Figure 13:
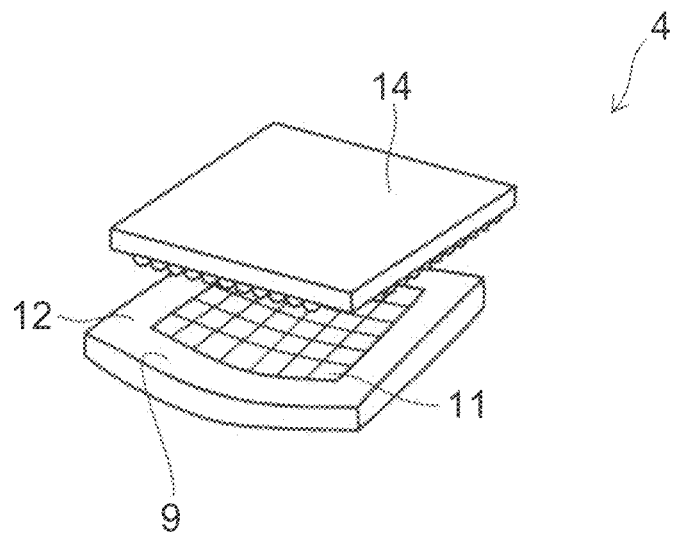
FIG. 13 is a perspective view illustrating a solid state imaging device according to an eighth embodiment.

FIG. 13 is a perspective view illustrating a solid state imaging device according to the eighth embodiment.

As shown in FIG. 13, in a solid state imaging device 4 according to the embodiment, the sensor substrate 12 is curved such that the upper face 9 is recessed. Meanwhile, the microlens array substrate 14 provided facing the upper face 9 of the sensor substrate 12 is flat. The connection posts 17 may not be provided.

The configuration, the operation, and the advantage of the embodiment other than the foregoing ones in the embodiment are the same as the configuration, the operation, and the advantage of the seventh embodiment described above.

Ninth Embodiment

Figure 14:
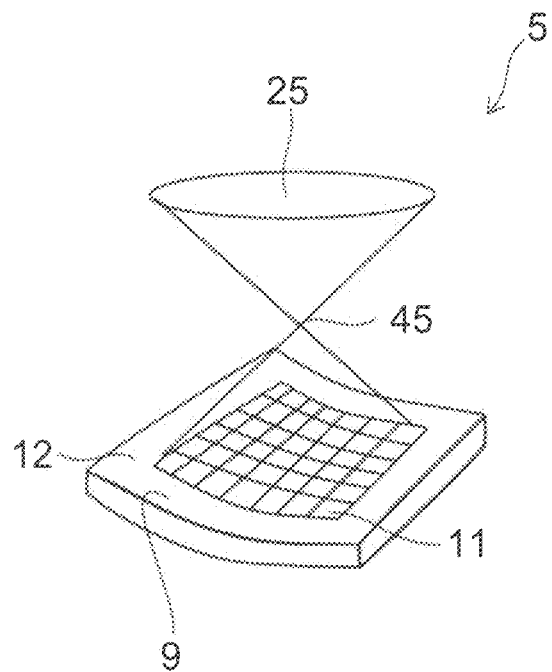
FIG. 14 is a perspective view illustrating a solid state imaging device according to a ninth embodiment.

FIG. 14 is a perspective view illustrating a solid state imaging device according to a ninth embodiment.

As shown in FIG. 14, in a solid state imaging device 5 according to the embodiment, the sensor substrate 12 is curved such that the upper face 9 is recessed. In addition, the imaging lens 25 is provided on the upper face 9 side of the sensor substrate 12. The sensor substrate 12 may be curved such that distances from the focal point 45 of the imaging device 25 to the pixels 11 become equal to each other.

The microlens array substrate 14 may not be provided.

The configuration, the operation, and the advantage of the embodiment other than the foregoing ones in the embodiment are the same as the configuration, the operation, and the advantage of the seventh embodiment described above.

Tenth Embodiment

Figure 15A:
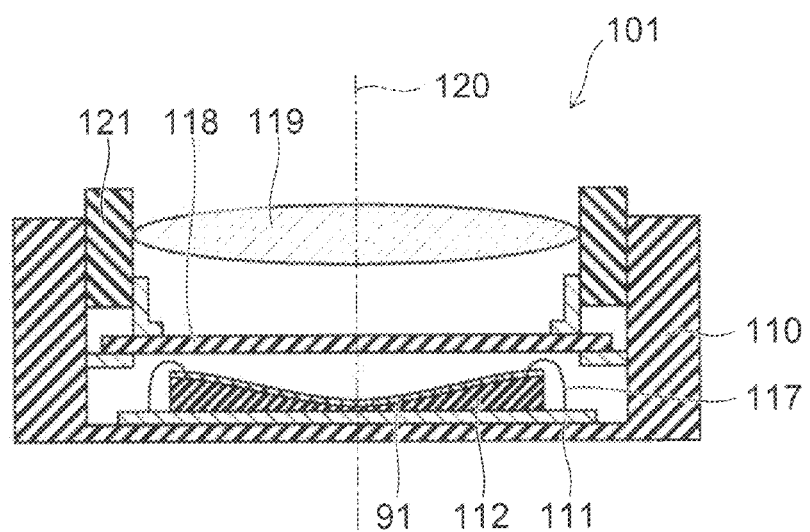
FIG. 15A is a cross-sectional view illustrating a solid state imaging device according to a tenth embodiment.
Figure 15B:
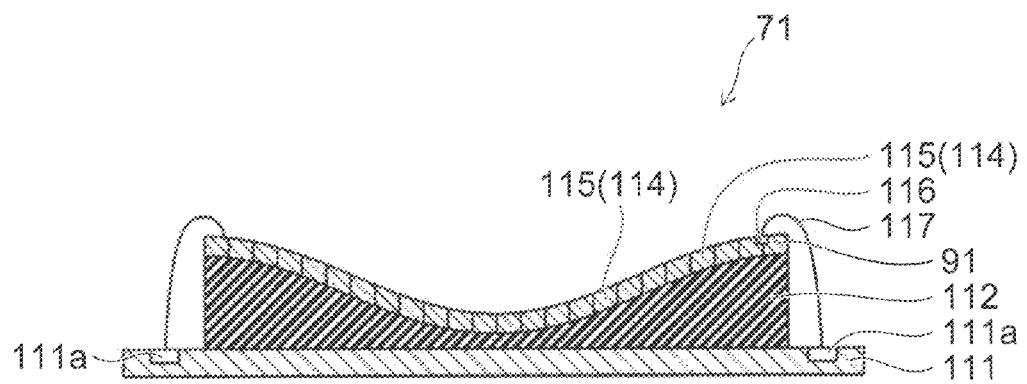
FIG. 15B is a cross-sectional view illustrating a solid state imaging element in the solid state imaging device according to the tenth embodiment.

FIG. 15A is a cross-sectional view illustrating a solid state imaging device according to a tenth embodiment. FIG. 15B is a cross-sectional view illustrating a solid state imaging element in the solid state imaging device according to the tenth embodiment.

Figure 16A:
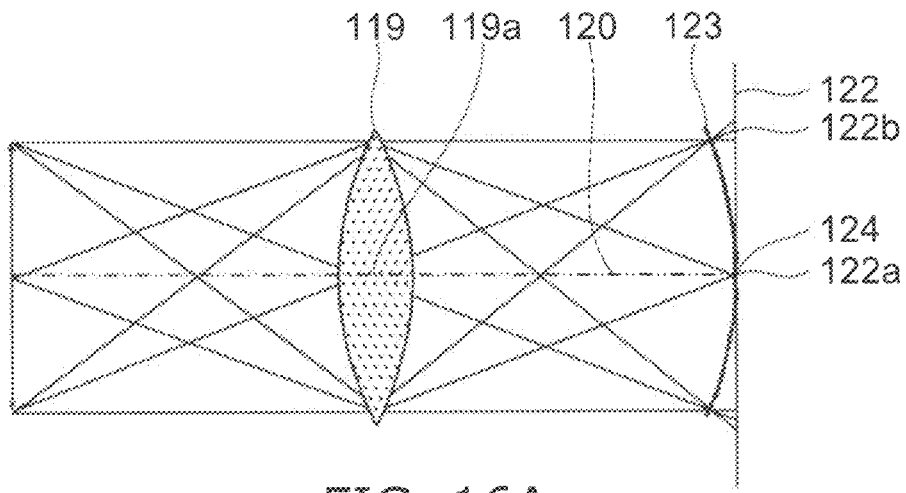
FIGS. 16A and 16B are views illustrating field curvature in the solid state imaging device according to the tenth embodiment.
Figure 16B:
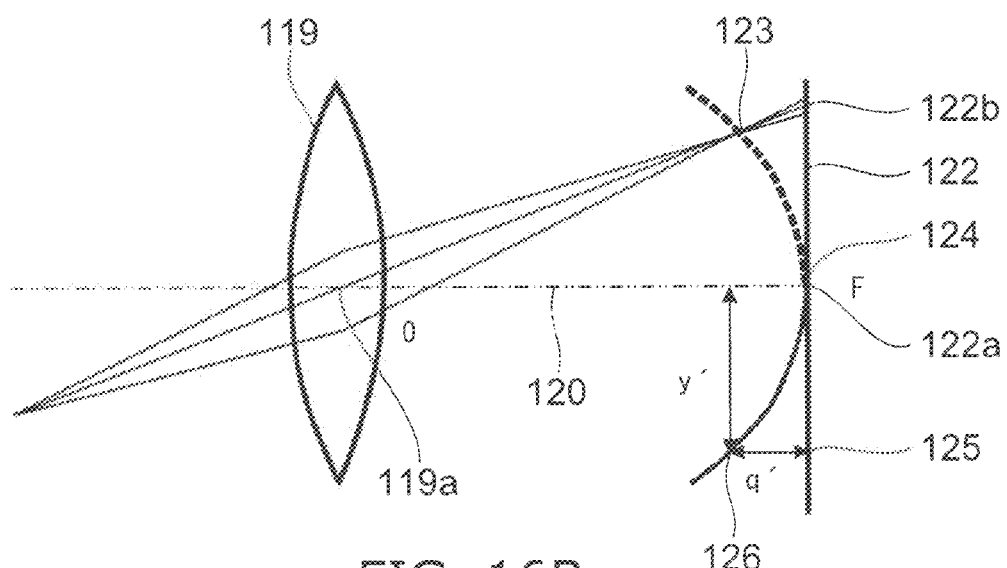

FIGS. 16A and 16B are views illustrating field curvature in the solid state imaging device according to the tenth embodiment.

As shown in FIGS. 15A and 15B, in a solid state imaging device 101 according to the embodiment, a module housing 110 is provided. The module housing 110 has the form of a container that is open at the top of the module housing 110. A mounting substrate 111 is provided inside the module housing 110. The mounting substrate 111 is disposed on the bottom face inside the module housing 110.

Post-processing circuits 111a including a processing chip are provided in the mounting substrate 111.

A spacer 112 is provided on the mounting substrate 111. The lower face of the spacer 112 is in contact with the upper face of the mounting substrate 111. The upper face of the spacer 112 is recessed in a cone shape. That is, the thickness of a surrounding part of the spacer 112 becomes larger toward the end edges of the spacer 112.

An imaging element 91 is provided on the upper face of the spacer 112. The shape of the imaging element 91 is the form of a film of 50 micrometers (μm) in thickness. The imaging element 91 is disposed so as to be curved along the recessed shape of the upper face of the spacer 112. Therefore, the upper face of the imaging element 91 is curved so as to be recessed. If the thickness of the imaging element 91 is 0.1 to 50 micrometers (μm), the imaging element 91 is easily curved.

The spacer 112 is disposed between the lower face of the imaging element 91 and the mounting substrate 111. The mounting substrate 111 is disposed below the imaging element 91. What includes the imaging element 91 is referred to as a solid imaging element 71. The solid imaging element 71 according to the embodiment includes the imaging element 91, the mounting substrate 111, and the spacer 112.

The solid imaging element 91 includes a semiconductor layer 114. Photodiodes serving as pixels 115, a drive/read-out circuit (not shown), and electrode pads 116 for reading pixels are provided in the semiconductor layer 114. Electrically conductive, for example, metal wires 117 each are connected to the electrode pads 116 for reading pixels, and wiring is drawn out. The other ends of the wires 117 each are connected to the post-processing circuits 111a in the mounting substrate 111.

A visible light transmission filter 118, for example, an IRCF (infrared cut-off filter) is provided on the imaging element 91. The visible light transmission filter 118 is fixed to the side face inside the module housing 110. The visible light transmission filter 118 is formed by using a material for cutting unnecessary infrared light. An imaging lens 119 is provided on the visible light transmission filter 118. A light axis 120 of the imaging lens 119 is disposed so as to intersect with the upper face of the imaging element 91. The imaging lens 119 is attached to a lens holder 121, and is fixed to the side face inside the module housing 110. A light-shielding cover for blocking unnecessary light is attached on a periphery of the solid state imaging device 101 (not shown).

The amount by which the imaging element 91 is curved is determined based on the field curvature aberration described below.

Field curvature aberration is a phenomenon in which an image to be formed by passing through the imaging lens 119 is not formed on a plane perpendicular to the light axis 120, and is formed on a curved surface. The curved surface is curved so as to be recessed in the direction of the imaging lens 119. That is, it is the phenomenon in which the image is shifted (inclined) in the direction of the imaging lens 119 as the image is more distant from the light axis 120.

As shown in FIGS. 16A and 16B, in a plane 122 which includes an intersection point 122a of the light axis 120 with the upper face of the imaging element 91 (not shown) and which is perpendicular to the light axis 120, the distance from the center 119a of the imaging lens 119 to a peripheral part 122b of the plane 122 is longer than the distance from the center 119a of the imaging lens 119 to the intersection point 122a. Therefore, in the case of a lens in which field curvature aberration is not corrected, an image-forming position 123 in the peripheral part 122b is shifted from the plane 122 toward the imaging lens 119 side. In general, an imaging surface of an imaging element such as a CMOS image sensor is a flat surface, and the imaging element is disposed perpendicular to the light axis 120. Therefore, if an image is formed by using a lens in which the correction of field curvature is not performed, the image is out of focus as it goes away from the central part on the imaging surface. Field curvature is an aberration in a close relationship with astigmatism.

As shown in FIG. 16B, field curvature can be described by Petzval sum.

The Petzval sum is expressed by the following mathematical formula (1), (Mathematical formula 1)

$$P = \sum_{1}^{N} \frac{1}{nf} \quad (1)$$

where n represents the refractive index of the imaging lens 119, f represents the focal length of the imaging lens, and N represents the number of imaging lenses. Any position 125 on the plane 122 is derived from the mathematical formula (1). The amount q' shifted from the position 125 to the imaging lens 119 side is derived from a mathematical formula (2).

(Mathematical formula 2)

$$q = \frac{y^2}{2} nP \quad (2)$$

where y' represents the distance between the main light axis 120 and the position 125, and n represents the refractive index of the imaging lens. It is possible to derive a curvature for curving the imaging element 91 from the mathematical formula (1) and the mathematical formula (2). Because of this, it is possible to obtain the distance between any point on the upper face of the imaging element 91 and the plane 122 by using the refractive index of the imaging lens 119 and the focal length f of the imaging lens.

Next, an operation of the solid imaging element according to the embodiment will be described.

Light from a subject is condensed by passing through the imaging lens 119, and forms an image on the upper face of the imaging element 91. The image formed by passing through the imaging lens 119 is formed on a curved surface. The imaging element 91 is curved so as to be fitted into the curved surface. Therefore, the image formed by passing through the imaging lens 119 is formed on the curved upper face of the imaging element 91.

The information of the pixels 115 due to the image formed on the imaging element 91 is sent from the electrode pads 116 for reading pixels through the wires 117 to the post-processing circuits 111a in the mounting substrate 111, and is processed.

Next, an advantage of the embodiment will be described. According to the embodiment, by curving the imaging element 91, it is possible to suppress field curvature aberration. Because of this, it is possible to achieve high picture quality in an imaging output obtained from the solid state imaging device 101.

In addition, there is no need for increasing the number of lenses due to field curvature aberration correction, and it is possible to reduce the size, the weight, and the cost of the solid state imaging device 101.

Furthermore, since an additional optical element is not interposed, it is possible to reduce optical loss, and to reduce optical crosstalk (color mixture).

The visible light transmission filter may be a film for cutting infrared light.

Comparative Example

Next, a comparative example of the tenth embodiment will be described.

Figure 17:
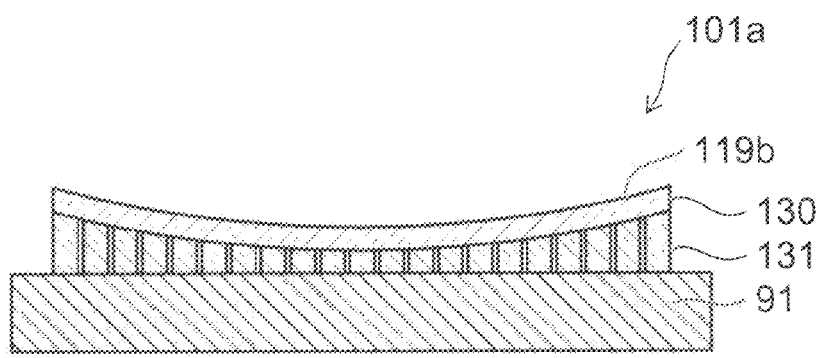
FIG. 17 is a cross-sectional view illustrating a solid state imaging device according to the comparative example of the tenth embodiment.

FIG. 17 is a cross-sectional view illustrating a solid state imaging device according to the comparative example of the tenth embodiment. As shown in FIG. 17, a solid state imaging device 101a according to the comparative example includes a transparent substrate 130 having the form of a curved surface corresponding to field curvature aberration, and a light transmission tube 131 connected to the transparent substrate 130, between an imaging surface 119b of an imaging lens (not shown) and the imaging element 91. The light passing through the imaging lens (not shown) forms an image on the transparent substrate 130 having the form of the curved surface corresponding to field curvature aberration. Then, the formed image passes through the light transmission tube 131 to reach the imaging element 91.

In the comparative example, the transparent substrate 130 having the form of a curved surface and the light transmission tube 131 connected to the transparent substrate 130 are necessary. Accordingly, it is impossible to reduce the size and the weight of the solid state imaging device 101a. In addition, production cost is increased. Furthermore, it is necessary to align, with a high degree of accuracy, the position between the light transmission tube 131 and the imaging element 91. The number of manufacturing processes is increased. In addition, since light passes through the transparent substrate 130 and the light transmission tube 131, optical losses are generated.

Eleventh Embodiment

Next, an eleventh embodiment will be described.

Figure 18:
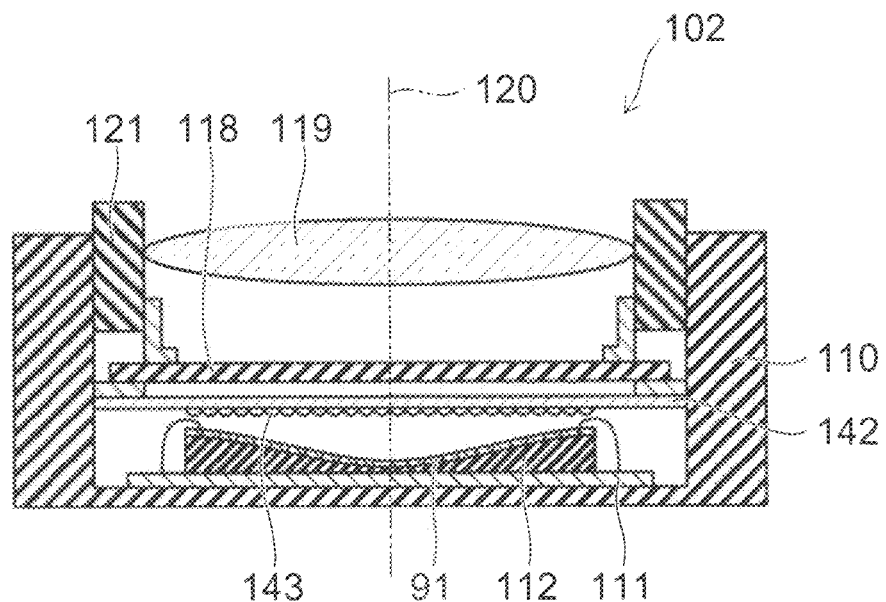
FIG. 18 is a cross-sectional view illustrating a solid state imaging device according to an eleventh embodiment.

FIG. 18 is a cross-sectional view illustrating a solid state imaging device according to the eleventh embodiment.

As shown in FIG. 18, in a solid state imaging device 102 according to the embodiment, a microlens array substrate 142 is provided between the imaging element 91 and the imaging lens 119. The microlens array substrate 142 is formed by using a transparent substrate, for example, a quartz plate. A plurality of microlenses 143 are formed on the microlens array substrate 142. The microlens array substrate 142 is disposed so that the face of the microlens array substrate 142 on which the microlenses 143 are formed, faces the upper face of the imaging element 91. In addition, the upper face of the imaging element 91 is separated from the microlens array substrate 142.

Next, an operation of the solid state imaging device 102 according to the embodiment will be described.

Lights from a subject are condensed by passing through the imaging lens 119, and enter into the microlens array substrate 142. Among the lights having entered the microlens array substrate 142, lights having reached the microlenses 143 pass through the respective microlenses 143 and are condensed for the respective microlenses 143, and then images are formed for the respective microlenses 143 on the upper face of the imaging element 91. The distance to the subject is measured based on the images formed by the respective microlenses 143. The configuration, the operation, and the advantage of the embodiment other than the foregoing ones in the embodiment are the same as the configuration, the operation, and the advantage of the tenth embodiment described above.

Twelfth Embodiment

Next, a twelfth embodiment will be described.

Figure 19:
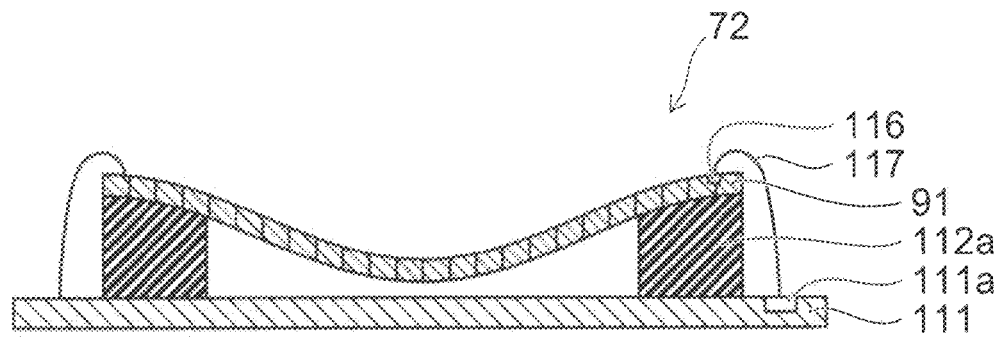
FIG. 19 is a cross-sectional view illustrating a solid state imaging element according to a twelfth embodiment.

FIG. 19 is a cross-sectional view illustrating a solid imaging element according to the twelfth embodiment.

As shown in FIG. 19, a solid imaging element 72 according to the embodiment includes the imaging element 91, the mounting substrate 111, and spacers 112a. The spacers 112a are disposed between the lower faces of peripheral parts of the imaging element 91 and the mounting substrate 111. Although the peripheral parts of the imaging element 91 are supported by the spacers 112a, the central part of the imaging element 91 is not supported by the spacer 112a. The part between the mounting substrate 111 and the central part of the imaging element 91 is a cavity.

The imaging element 91 is configured as a bridge supported by the spacers 112a. A stress is applied to the imaging element 91 by the spacers 112a in the direction from the end edges toward the central part of the imaging element 91. The wires 117 connect the electrode pads 116 for reading pixels and the post-processing circuits 111a.

According to the embodiment, since the cavity is formed below the central part of the imaging element 91, heat radiation is improved. The configuration, the operation, and the advantage of the embodiment other than the foregoing ones in the embodiment are the same as the configuration, the operation, and the advantage of the tenth embodiment described above.

Thirteenth Embodiment

Next, a thirteenth embodiment will be described.

Figure 20:
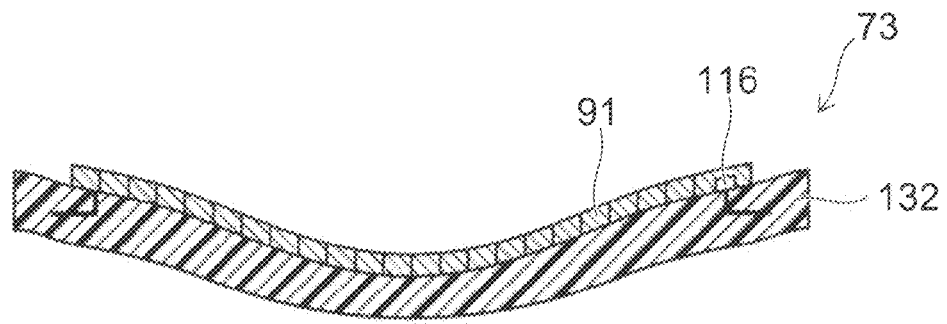
FIG. 20 is a cross-sectional view illustrating a solid state imaging element according to a thirteenth embodiment.

FIG. 20 is a cross-sectional view illustrating a solid imaging element according to the thirteenth embodiment.

As shown in FIG. 20, a solid imaging element 73 according to the embodiment includes the imaging element 91 and a flexible substrate 132. The flexible substrate 132 is disposed so as to contact the lower face of the imaging element 91. By curving, at a given curvature, the flexible substrate 132 on which the imaging element 91 is disposed, it is possible to curve also the imaging element 91.

In addition, in the embodiment, the electrode pads 116 for reading pixels are provided on the lower face of the imaging element 91. Then, a so-called surface mount type is used in which electrodes are drawn from the electrode pads 116 for reading pixels provided on the lower face. The configuration, the operation, and the advantage of the embodiment other than the foregoing ones in the embodiment are the same as the configuration, the operation, and the advantage of the tenth embodiment described above.

The electrode pads 116 for reading pixels may be provided on the upper face of the imaging element 91, and wire bonding may be performed with the wires 117 from the upper face. In addition, the imaging element 91 may be bonded to the flexible substrate 132.

Fourteenth Embodiment

Figure 21:
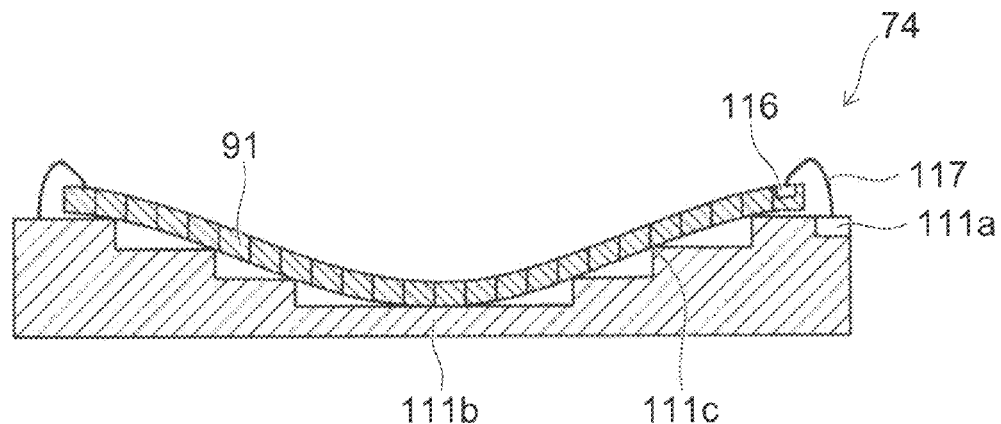
FIG. 21 is a cross-sectional view illustrating a solid state imaging element according to a fourteenth embodiment.

FIG. 21 is a cross-sectional view illustrating a solid imaging element according to the fourteenth embodiment.

As shown in FIG. 21, a solid imaging element 74 according to the embodiment includes the imaging element 91 and a mounting substrate 111*b*. The shape of the mounting substrate 111*b* is a stepped shape in which a plurality of steps are provided on the upper face of the mounting substrate 111*b*. The upper face of the mounting substrate 111*b* is lowest in the central part, and the height is increased for each step from the central part toward the end edges. The curved imaging element 91 is disposed on the mounting substrate 111*b*. The lower face of the imaging element 91 is in contact with corners 111*c* of the steps of the upper face of the mounting substrate 111*b*. An organic adhesive material, for example, is used for the connection of the imaging element 91 and the mounting substrate 111*b*. The wires 117 connect the electrode pads 116 for reading pixels and the post-processing circuits 111*a*. By increasing the steps of the mounting substrate 111*b*, it is possible to accurately suppress the amount by which the imaging element 91 is curved. The configuration, the operation, and the advantage of the embodiment other than the foregoing ones in the embodiment are the same as the configuration, the operation, and the advantage of the tenth embodiment described above.

Fifteenth Embodiment

Next, a fifteenth embodiment will be described.

Figure 22A:
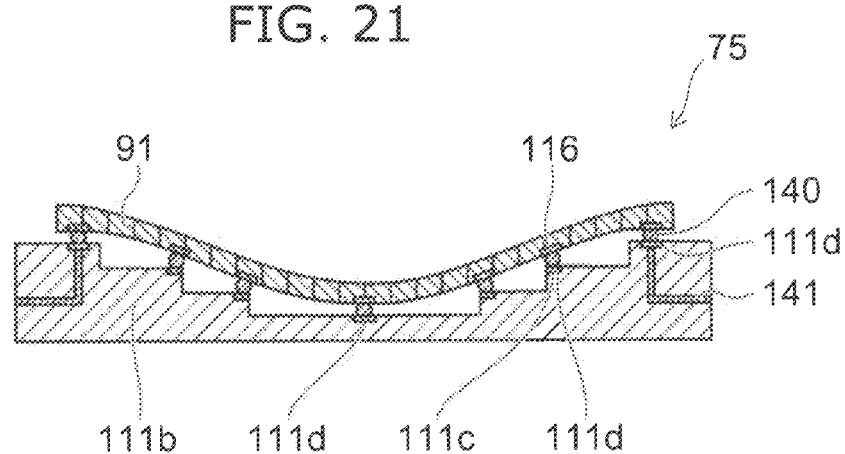
FIG. 22A is a cross-sectional view illustrating a solid state imaging element according to a fifteenth embodiment.
Figure 22B:
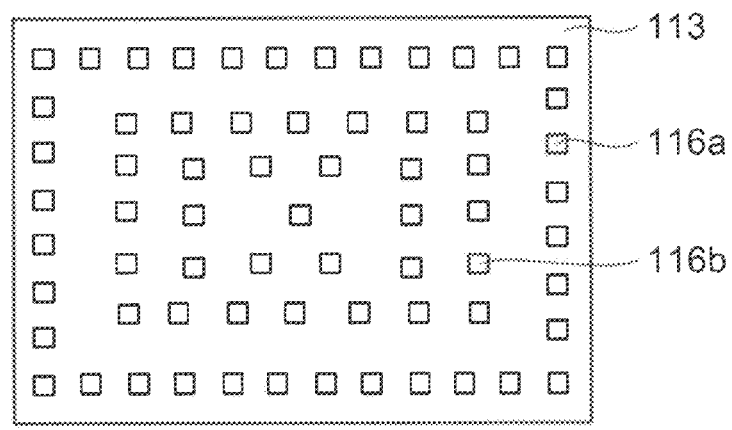
FIG. 22B is a bottom view illustrating an imaging element in the solid imaging element according to the fifteenth embodiment.

FIG. 22A is a cross-sectional view illustrating a solid imaging element according to a fifteenth embodiment. FIG. 22B is a bottom view illustrating an imaging element in the solid imaging element according to the fifteenth embodiment.

As shown in FIG. 22A, in a solid imaging element 75 according to the embodiment, the shape of the mounting substrate 111*b* is a stepped shape in which a plurality of steps are provided on the upper face. Electrode parts 111*d* of the post-processing circuits 111*a* are provided on the upper face of the central part, at the corners 111*c*, and on the upper faces of the peripheral parts in the mounting substrate 111*b*. The electrode pads 116 for reading pixels of the imaging element 91 are provided on the lower face of the imaging element 91. Solder bumps 140 are provided between the electrode pads 116 for reading pixels and the electrode parts 111*d*. The solder bumps 140 connect the electrode pads 116 for reading pixels and the electrode parts 111*d* electrically. Lead-out wirings 141 extending from the electrode parts 111*d* to the side faces of the mounting substrate 111*b* are provided inside the mounting substrate 111*b*. Electric signals are input and output to the outside of the solid imaging element 75 via the lead-out wirings 141.

As shown in FIG. 22B, the plurality of electrode pads 116 for reading pixels are provided on the lower face of the imaging element 91. As viewed from below the imaging element 91, a plurality of electrode pads 116*a* for reading pixels disposed along a peripheral region of the lower face of the imaging element 91 are connected to the lead-out wirings 141 for inputting and outputting electric signals as so-called I/O electrodes. In contrast, in the lower face of the imaging element 91, electrode pads 116*b* for reading pixels disposed in the central region reinforce the physical bonding of the mounting substrate 111*b* and the imaging element 91 for reading pixels as so-called dummy electrodes.

Both of the electrode pad 116*a* for reading pixels serving as an I/O electrode and the electrode pad 116*b* for reading pixels serving as a dummy electrode are provided in the solid imaging element 75 according to the embodiment. Because of this, by utilizing the wettability of the solders of the solder bumps 140, it is possible to support the imaging element 91 at multiple points. In addition, by the reflow of solder at the time of mounting, it is possible to curve the imaging element 91 in a self-aligning manner. The configuration, the operation, and the advantage of the embodiment other than the foregoing ones in the embodiment are the same as the configuration, the operation, and the advantage of the tenth embodiment described above.

Sixteenth Embodiment

Figure 23:
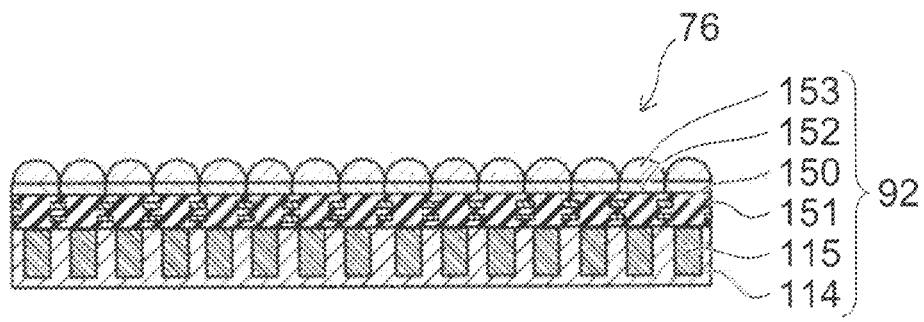
FIG. 23 is a cross-sectional view illustrating a solid state imaging element according to a sixteenth embodiment.

FIG. 23 is a cross-sectional view illustrating a solid imaging element according to a sixteenth embodiment.

The embodiment is directed to a frontside illumination type solid imaging element.

As shown in FIG. 23, a solid imaging element 76 according to the embodiment includes an imaging element 92. The imaging element 92 is provided with the semiconductor layer 114. The semiconductor layer 114 is formed of a semiconductor material, for example, silicon. The plurality of pixels 115 are formed on the semiconductor layer 114. The pixels 115 are, for example, photodiodes. As viewed from on the imaging element 92, the plurality of pixels 115 are provided in an array in the semiconductor layer 114.

A drive/read-out circuit (not shown) is formed in the semiconductor layer 114.

A multilayer wiring layer 151 is provided on the imaging element 114. The multilayer wiring layer 151 connects the pixels 115 and the drive/read-out circuit (not shown). An interlayer insulating film 150 is provided so as to cover the multilayer wiring layer 151. Each color filter 152 is provided on the interlayer insulating film 150 of each pixel 115. Each pixel-condensing microlens 153 is provided on the corresponding color filter 152 of each pixel 115. The thickness of the imaging element 92 is 1 to 50 micrometers (μm), and is preferably 1 to 10 micrometers (μm).

In the solid imaging element 76 according to the embodiment, since the thickness of the solid imaging element 76 is small, it is possible to curve the solid imaging element 76. Because of this, it is possible to suppress field curvature aberration and to achieve high picture quality in an imaging output obtained from the imaging element 92.

Seventeenth Embodiment

Next, a seventeenth embodiment will be described.

Figure 24:
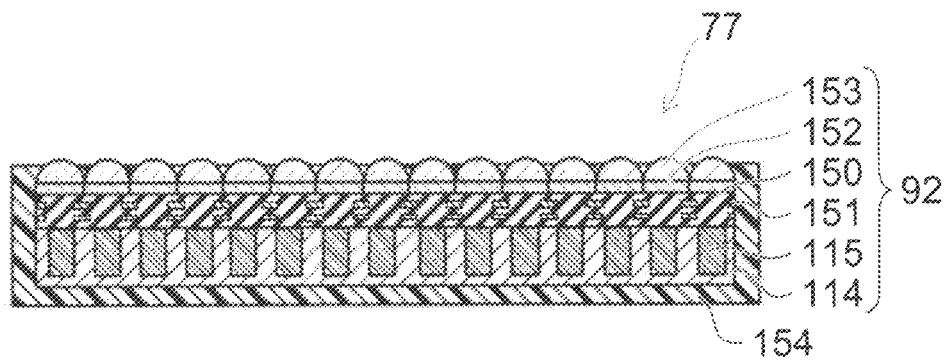
FIG. 24 is a cross-sectional view illustrating a solid state imaging element according to a seventeenth embodiment.

FIG. 24 is a cross-sectional view illustrating a solid imaging element according to the seventeenth embodiment.

As shown in FIG. 24, a solid imaging element 77 according to the embodiment includes an imaging element 92. The imaging element 92 is coated with an organic film 154. As the organic film 154, a transparent film, i.e., a film transmitting light in a visible wavelength range is used. The organic film 154 is parylene, for example. Parylene is a general term of paraxylene polymer, and has a structure in which a benzene ring is connected via $CH_2$. The thickness of the organic film 154 to be coated is 0.1 to 10 micrometers (μm).

Next, an advantage of the embodiment will be described.

The imaging element 92 includes the semiconductor layer 114. When single crystal silicon is used as the material of the semiconductor layer 114, cleavage and breakage are generated along the crystal orientation of the semiconductor layer 114 by only applying a small force to the imaging element 92.

According to the embodiment, the imaging element 92 formed into a thin layer is coated with the organic film 154. Accordingly, it is possible to reduce load at the time of curving, of the imaging element 92. Thereby, in the solid imaging element 77, it is possible to suppress mechanical breakage and to curve the imaging element 92.

In addition, Parylene is an extremely chemically stable substance, and is inactive against various solvents and medicals. Parylene has a low dielectric constant and electrical insulation properties. Parylene is excellent in mechanical properties and light transmission properties. Furthermore, polymerized paraxylene is a stable crystalline polymer, has a high crystallinity, and is excellent in crevice penetration properties. Accordingly, it is possible to enhance the durability, insulation properties, mechanical properties, and light transmission properties of the imaging element 92. The configuration and the advantage of the embodiment other than the foregoing ones in the embodiment are the same as the configuration and the advantage of the sixteenth embodiment described above.

Eighteenth Embodiment

Next, an eighteenth embodiment will be described.

Figure 25:
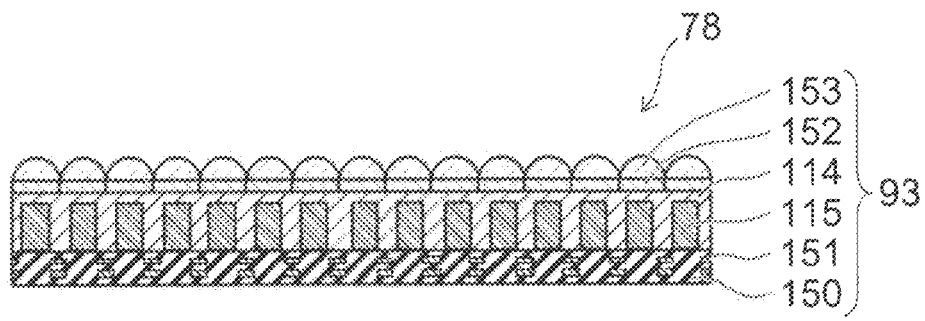
FIG. 25 is a cross-sectional view illustrating a solid state imaging element according to an eighteenth embodiment.

FIG. 25 is a cross-sectional view illustrating a solid imaging element according to the eighteenth embodiment.

The embodiment is directed to a backside illumination type solid imaging element.

As shown in FIG. 25, a solid imaging element 78 according to the embodiment includes an imaging element 93. The semiconductor layer 114 is provided in the imaging element 93. The plurality of pixels 115 are formed in the lower part of the semiconductor layer 114. As viewed from below the imaging element 93, the plurality of pixels 115 are provided in an array in the semiconductor layer 114.

A drive/read-out circuit (not shown) is formed in the semiconductor layer 114.

The multilayer wiring layer 151 is provided on the lower face of the semiconductor layer 114. The interlayer insulating film 150 is provided so as to cover the multilayer wiring layer 151.

Each color filter 152 is provided on the upper face of the semiconductor layer 114 of each pixel 115. Each pixel-condensing microlens 153 is provided on the corresponding color filter 152 of each pixel 115. The thickness of the imaging element 93 is 0.1 to 50 micrometers (μm) and is preferably 1 to 10 micrometers (μm).

In the solid imaging element 78 according to the embodiment, the multilayer wiring layer 151 is provided on the side opposite to the face on which light is incident. Therefore, no incident light is reflected by the multilayer wiring layer 151. Because of this, it is possible to reduce optical loss. The configuration, the operation, and the advantage of the embodiment other than the foregoing ones in the embodiment are the same as the configuration, the operation, and the advantage of the sixteenth embodiment described above.

Nineteenth Embodiment

Next, a nineteenth embodiment will be described.

Figure 26:
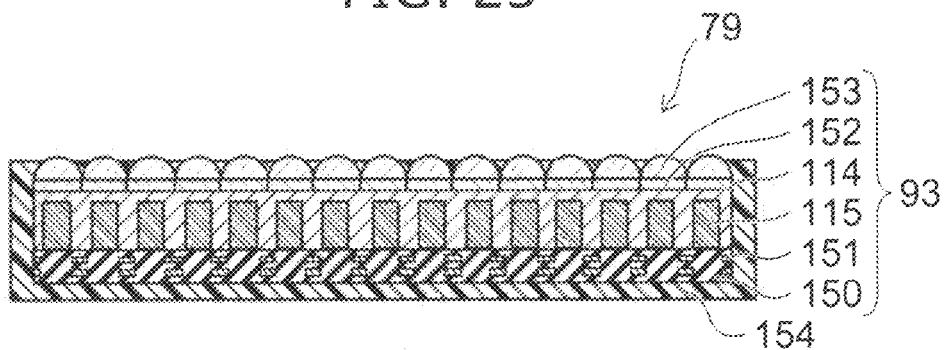
FIG. 26 is a cross-sectional view illustrating a solid state imaging element according to a nineteenth embodiment.

FIG. 26 is a cross-sectional view illustrating a solid imaging element according to the nineteenth embodiment.

As shown in FIG. 26, a solid imaging element 79 according to the embodiment includes the imaging element 93. Then, the imaging element 93 is coated with the organic film 154. Also in the embodiment, the thickness of the organic film 154 to be coated is 0.1 to 10 micrometers. The configuration, the operation, and the advantage of the embodiment other than the foregoing ones in the embodiment are the same as the configuration, the operation, and the advantage of the seventeenth embodiment described above.

Twentieth Embodiment

Next, a twentieth embodiment will be described.

Figure 27A:
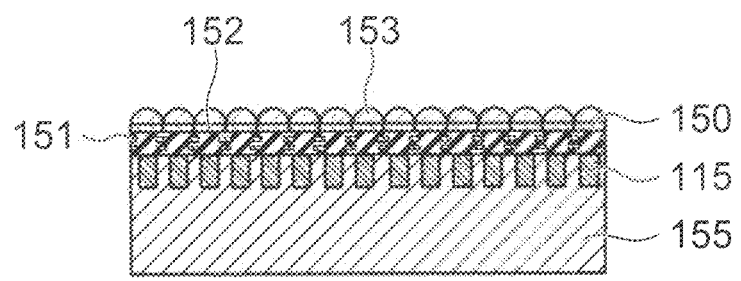
FIGS. 27A to 27C are process cross-sectional views illustrating a method for manufacturing a solid state imaging element according to a twentieth embodiment.
Figure 27B:
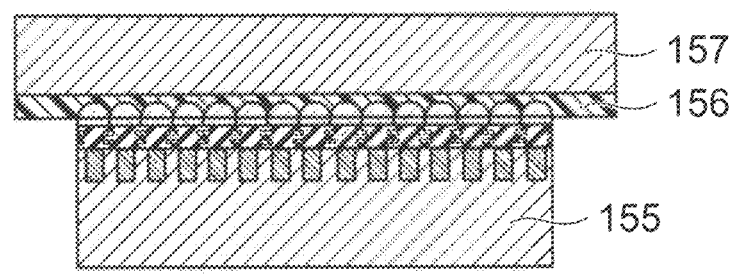
Figure 27C:
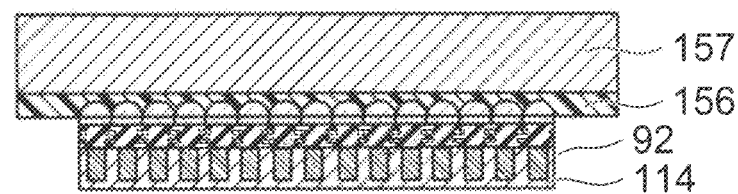

FIGS. 27A to 27C are process cross-sectional views illustrating a method for manufacturing a solid imaging element according to the twentieth embodiment.

The embodiment is directed to a method for manufacturing the frontside illumination type solid imaging elements 76 and 77.

First, as shown in FIG. 27A, the pixels 115 are formed in a semiconductor substrate 155, for example, a silicon substrate. The pixels 115 are formed in an array on the upper face of the semiconductor substrate 155 as viewed from on the semiconductor substrate 155. In addition, a drive/read-out circuit (not shown) is formed in the semiconductor substrate 155. Then, the pixels 115, the multilayer wiring layer 151 to which the drive/read-out circuit is connected, and the interlayer insulating film 150 covering the multilayer wiring layer are formed on the semiconductor substrate 155. After that, each color filter 152 is provided on the interlayer insulating film 150 of each pixel 115. Then, each pixel-condensing microlens 153 is disposed on the corresponding color filter 152 of each pixel 115.

Next, as shown in FIG. 27B, a supporting substrate 157 is bonded, via an adhesive layer 156, to the upper face of the semiconductor substrate 155. The supporting substrate 157 is, for example, quartz or silicon. An adhesive material releasable by light (for example, ultraviolet light), heat, or solvent is used for the adhesive layer 156.

Next, as shown in FIG. 27C, the lower part of the semiconductor substrate 155 is removed, and the semiconductor substrate 155 is formed into a thin layer. Formation into a thin layer is performed by back grinding or CMP (chemical mechanical polishing) or combination of both methods. Because of this, the semiconductor substrate 155 is formed into a thin layer, and is changed into the semiconductor layer 114. In this way, the imaging element 92 is formed.

Then, the imaging element 92 is peeled off from the supporting substrate 157. At least one method selected from a group including peeling by irradiation with ultraviolet (UV) light, peeling by thermal treatment, and peeling by solvent is used for the peeling of the supporting substrate 157.

In this way, as shown in FIG. 23, the solid imaging element 76 according to the sixteenth embodiment described above is manufactured.

Subsequently, the imaging element 92 may be coated with the organic film 154. The organic film 154 is parylene, for example. A deposition method is used for the coating of parylene. The thickness of coating is 0.1 to 10 micrometers. Because of this, as shown in FIG. 24, the solid imaging element 77 according to the seventeenth embodiment described above is manufactured.

According to the embodiment, the solid imaging elements 76 and 77 formed into thin layers can be manufactured. Therefore, it is possible to curve the solid imaging elements 76 and 77. Because of this, it is possible to suppress field curvature aberration and to achieve high picture quality in imaging output obtained from the solid imaging elements 76 and 77.

Twenty-First Embodiment

Next, a twenty-first embodiment will be described.

FIGS. 28A to 28D are process cross-sectional views illustrating a method for manufacturing a solid imaging element according to the twenty-first embodiment.

The embodiment is directed to a method for manufacturing the backside illumination type solid imaging elements 78 and 79.

Figure 28A:
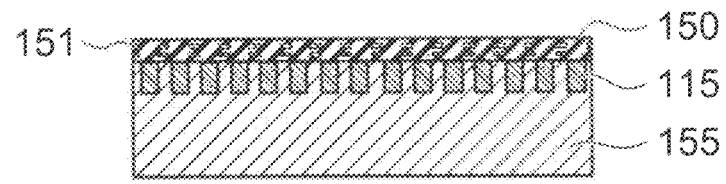
FIGS. 28A to 28D are process cross-sectional views illustrating a method for manufacturing a solid state imaging element according to a twenty-first embodiment.

First, as shown in FIG. 28A, the pixels 115 are formed on the semiconductor substrate 155. The pixels 115 are formed in an array on the upper face of the semiconductor substrate 155 as viewed from on the semiconductor substrate 155. In addition, a drive/read-out circuit (not shown) is formed in the semiconductor substrate 155. Then, the pixels 115, the multilayer wiring layer 151 to which the drive/read-out circuit is connected, and the interlayer insulating film 150 are formed on the semiconductor substrate 155.

Figure 28B:
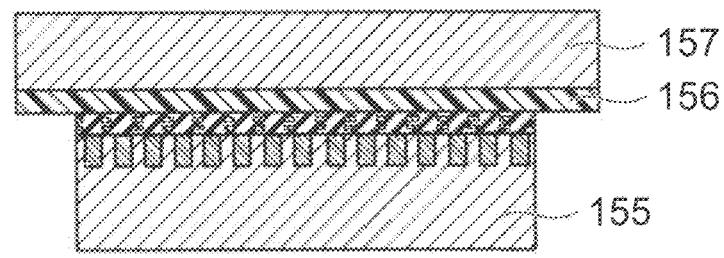

Next, as shown in FIG. 28B, the supporting substrate 157 is bonded, via the adhesive layer 156, to the upper face of the semiconductor substrate 155.

Figure 28C:
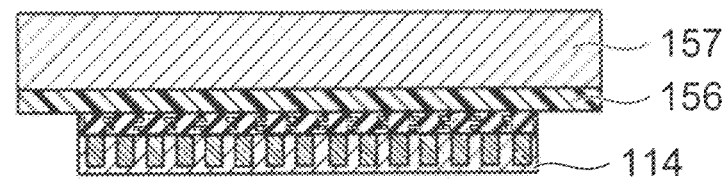

Then, as shown in FIG. 28C, the semiconductor substrate 155 is formed into a thin layer by grinding the lower part of the semiconductor substrate 155 and then removing it. The semiconductor substrate 155 is changed into the semiconductor layer 114 by being formed into a thin layer.

Figure 28D:
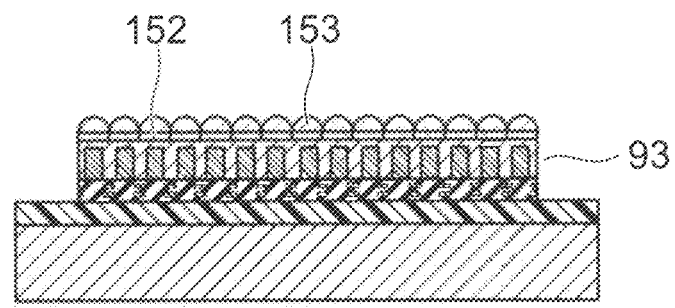

Next, as shown in FIG. 28D, each color filter 152 is disposed on the lower face of the semiconductor layer 114 of each pixel 115. In FIG. 28D, the semiconductor layer 114 and the supporting substrate 157 in FIG. 28C are shown upside down. Then, each pixel-condensing microlens 153 is disposed on the lower face of the corresponding color filter 152 of each pixel 115. Accordingly, the imaging element 93 is formed.

Next, the imaging element 93 is peeled off from the supporting substrate 157. In this way, as shown in FIG. 25, the solid imaging element 78 according to the eighteenth embodiment described above is manufactured.

Subsequently, by covering the imaging element 93 with the organic film 154, as shown in FIG. 26, the solid imaging element 79 according to the nineteenth embodiment described above may be formed.

According to the embodiment, the solid imaging elements 78 and 79 formed into thin layers can be manufactured. Accordingly, it is possible to curve the solid imaging elements 78 and 79. Thereby, it is possible to suppress field curvature aberration and to achieve high picture quality in imaging output obtained from the solid imaging elements 78 and 79.

Twenty-Second Embodiment

Next, a twenty-second embodiment will be described.

Figure 29A:
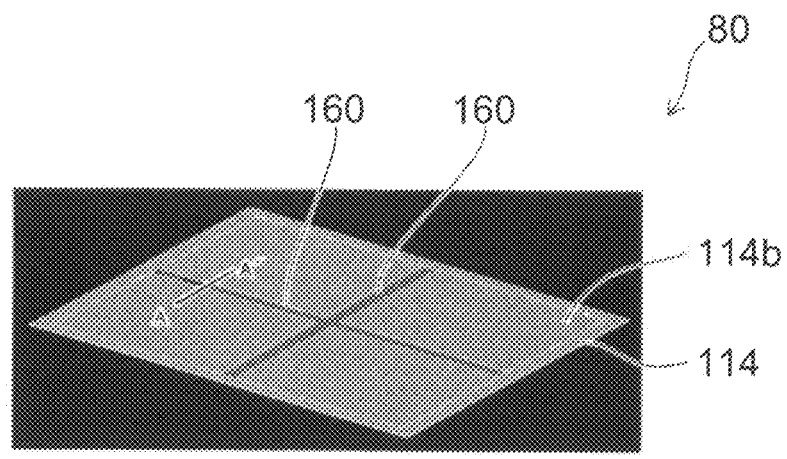
FIGS. 29A and 29B are views illustrating a solid state imaging element according to a twenty-second embodiment.
Figure 29B:
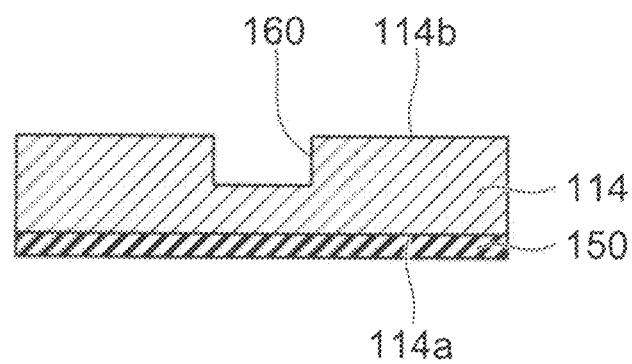

FIGS. 29A and 29B are views illustrating a solid imaging element according to the twenty-second embodiment. FIG. 22A is a perspective view. FIG. 22B is the cross section taken along the line A-A' shown in FIG. 22A.

As shown in FIGS. 29A and 29B, in a solid imaging element 80 according to the embodiment, notches 160 are formed on a surface 114b opposite to a surface 114a of the semiconductor layer 114 on which the interlayer insulating film 150 is provided. The direction from the surface 114a toward the surface 114b is defined as the upper side. The notches 160 have a cross shape as viewed from above. That is, the notches 160 extend in one direction and the other direction intersecting with the one direction in the surface 114b. The notches 160 do not penetrate the semiconductor layer 114. A remainder of the semiconductor layer 114 remains in a region directly under the notches 160.

When the solid imaging element 80 formed into a thin layer is curved, stress becomes larger at the most curved maximum displacing portion. In addition, strain becomes larger at the maximum displacing portion.

According to the embodiment, by forming notches in the semiconductor layer 114, it is possible to relieve the stress and strain generated when the solid imaging element 80 is curved. By forming a cross shape, it is possible to relieve stress and strain in the one direction and the other direction. The configuration, the operation, and the advantage of the embodiment other than the foregoing ones in the embodiment are the same as the configuration, the operation, and the advantage of the sixteenth embodiment described above.

Twenty-Third Embodiment

Next, a twenty-third embodiment will be described.

Figure 30A:
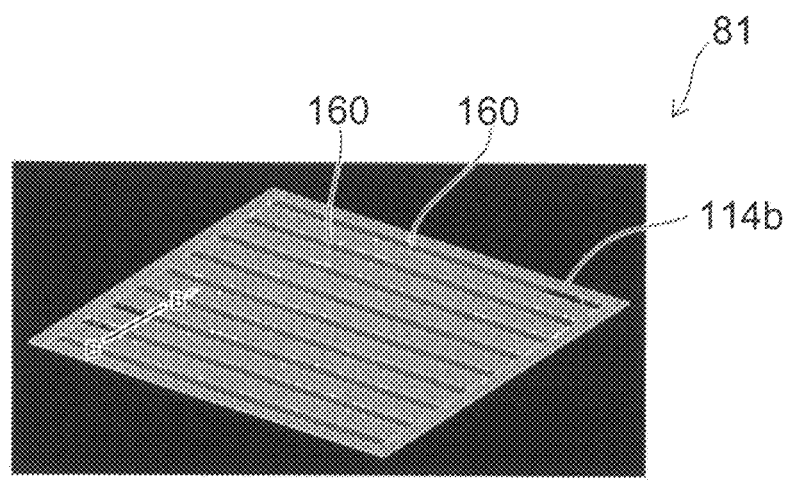
FIGS. 30A and 30B are views illustrating a solid state imaging element according to a twenty-third embodiment.
Figure 30B:
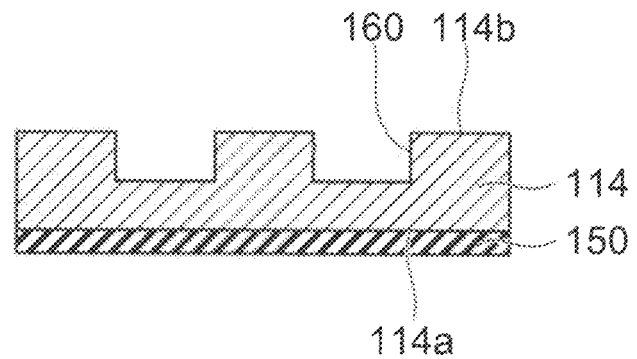

FIGS. 30A and 30B are views illustrating a solid imaging element according to the twenty-third embodiment. FIG. 30A is a perspective view. FIG. 30B is the cross section taken along the line B-B' shown in FIG. 30A.

As shown in FIGS. 30A and 30B, the notches 160 of a solid imaging element 81 according to the embodiment have the form of a plurality of lines extending in one direction on the surface 114b, as viewed from above.

According to the embodiment, it is possible to relieve the stress and strain generated when curved in the direction intersecting with the one direction, for example, in the direction perpendicular to the one direction. The configuration, the operation, and the advantage of the embodiment other than the foregoing ones in the embodiment are the same as the configuration, the operation, and the advantage of the twenty-second embodiment described above.

Modification Example of the Twenty-Third Embodiment

Figure 31:
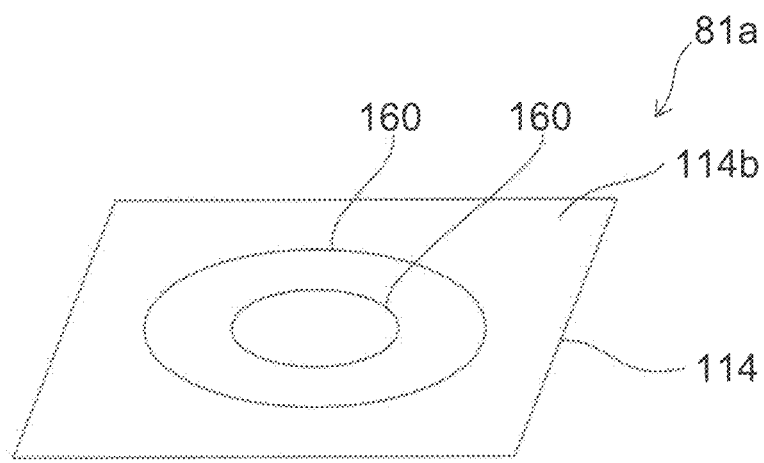
FIG. 31 is a perspective view illustrating a solid state imaging element according to a modification example of the twenty-third embodiment.

FIG. 31 is a perspective view illustrating a solid imaging element according to a modification example of the twenty-third embodiment.

As shown in FIG. 31, the notches 160 of a solid imaging element 81a according to the modification example are annularly, for example, concentrically formed on the surface 114b. Also, the notches 160 may be formed in a concentric quadrangular shape instead of concentrically. The configuration, the operation, and the advantage of the embodiment other than the foregoing ones in the embodiment are the same as the configuration, the operation, and the advantage of the twenty-second embodiment described above.

Twenty-Fourth Embodiment

Next, a twenty-fourth embodiment will be described.

Figure 32A:
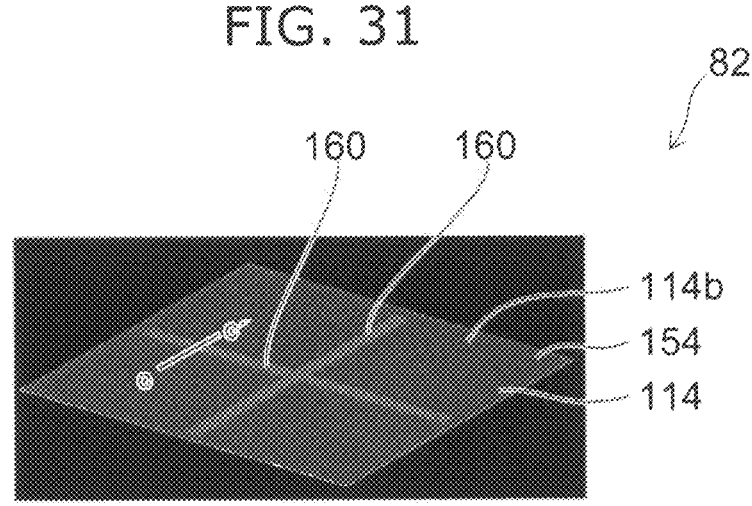
FIGS. 32A and 32B are views illustrating a solid state imaging element according to a twenty-fourth embodiment.
Figure 32B:
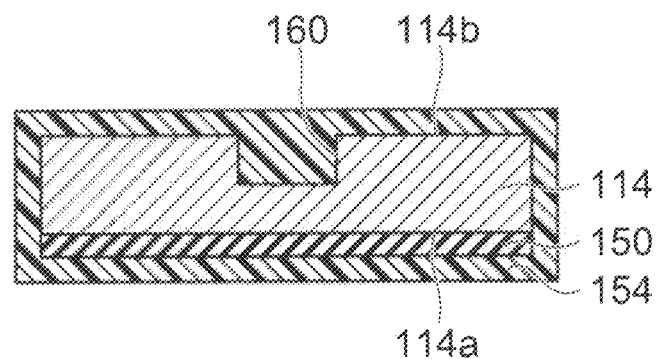

FIGS. 32A and 32B are views illustrating a solid imaging element according to the twenty-fourth embodiment. FIG.

32A is a perspective view. FIG. 32B is the cross section taken along the line C-C' shown in FIG. 32A.

As shown in FIGS. 32A and 32B, a solid imaging element 82 according to the embodiment is an embodiment in which the solid imaging element 80 according to the twenty-second embodiment described above is coated with the organic film 154. By covering the solid imaging element 80 with the organic film 154 in addition to a cross-shaped notch 160, it is possible to relieve the stress and strain when curved in one direction or the other direction, and to suppress mechanical breakage. The configuration, the operation, and the advantage of the embodiment other than the foregoing ones in the embodiment are the same as the configuration, the operation, and the advantage of the twenty-second embodiment described above.

Twenty-Fifth Embodiment

Next, a twenty-fifth embodiment will be described.

Figure 33A:
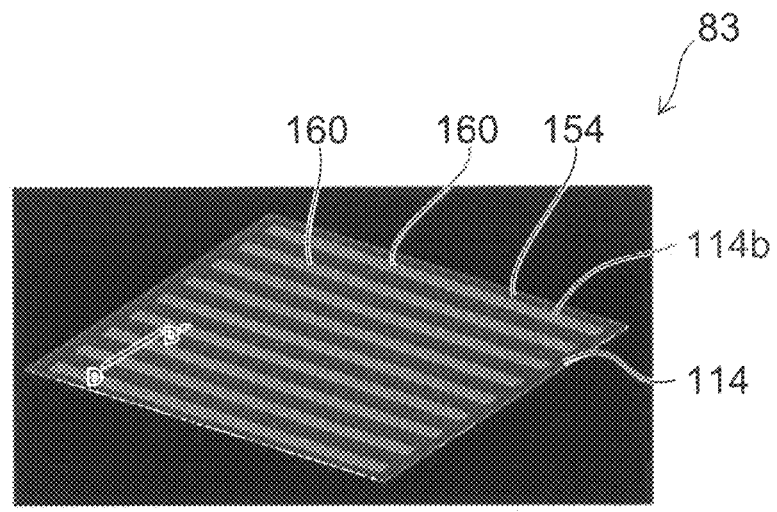
FIGS. 33A and 33B are views illustrating a solid state imaging element according to a twenty-fifth embodiment.
Figure 33B:
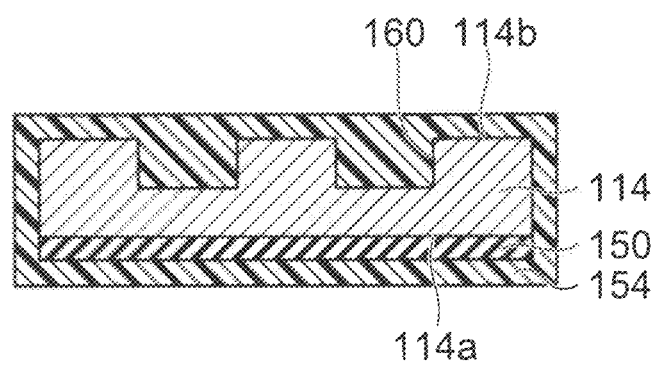

FIGS. 33A and 33B are views illustrating a solid imaging element according to the twenty-fifth embodiment. FIG. 33A is a perspective view. FIG. 33B is the cross section taken along the line D-D' shown in FIG. 33A.

As shown in FIGS. 33A and 33B, a solid imaging element 83 according to the embodiment is an embodiment in which the solid imaging element 81 according to the twenty-third embodiment described above is coated with the organic film 154. It is possible to relieve the stress and strain generated when curved in the direction perpendicular to one direction, and to suppress mechanical breakage. The configuration, the operation, and the advantage of the embodiment other than the foregoing ones in the embodiment are the same as the configuration, the operation, and the advantage of the twenty-second embodiment described above.

Modification Example of the Twenty-Fifth Embodiment

Next, a modification example of the twenty-fifth embodiment will be described.

Figure 34A:
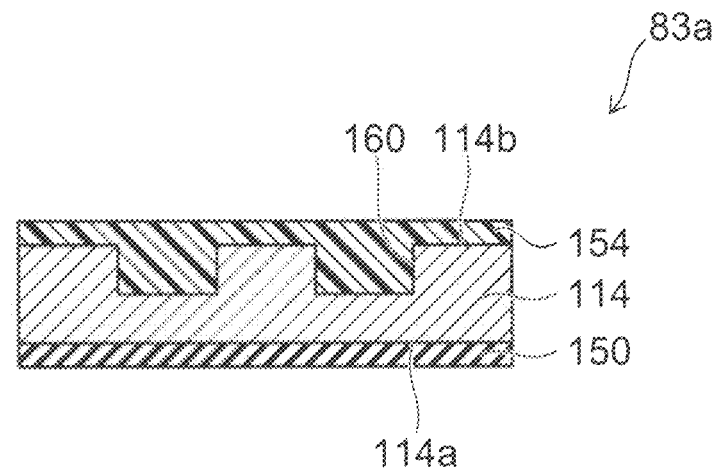
FIGS. 34A and 34B are cross-sectional views illustrating a solid state imaging element according to the modification example of the twenty-fifth embodiment.
Figure 34B:
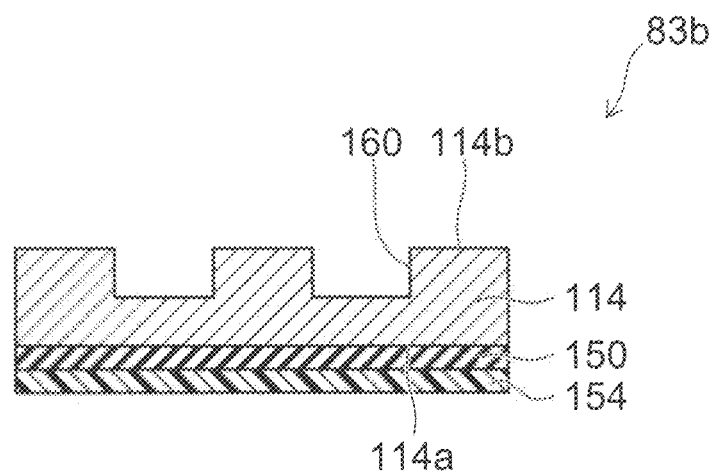

FIGS. 34A and 34B are cross-sectional views illustrating a solid imaging element according to the modification example of the twenty-fifth embodiment.

As shown in FIG. 34A, in a solid imaging element 83a according to the modification example of the twenty-fifth embodiment, the organic film 154 is formed on the face 114b, and may not be formed on the surface 114a.

In addition, as shown in FIG. 34B, the organic film 154 is formed on the face 114a, and may not be formed on the surface 114b.

According to the modification example, by forming the organic film 154 on one face of the semiconductor layer 114, it is possible to relieve the stress and strain generated when the solid imaging element 83a is curved.

Twenty-Sixth Embodiment

Next, a twenty-sixth embodiment will be described.

Figure 35A:
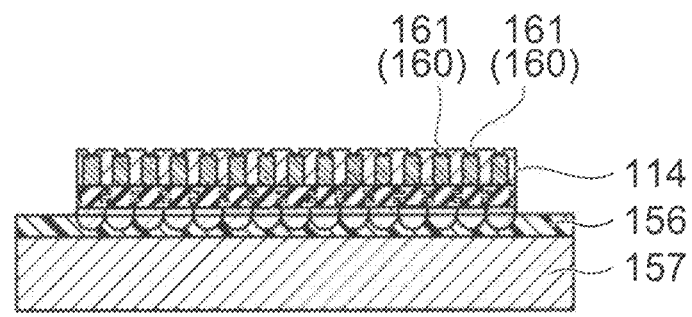
FIGS. 35A to 35C are cross-sectional views illustrating a method for manufacturing a solid state imaging element according to a twenty-sixth embodiment.
Figure 35B:
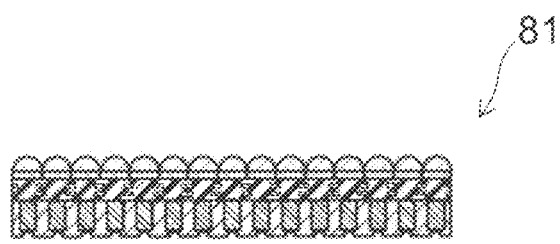
Figure 35C:
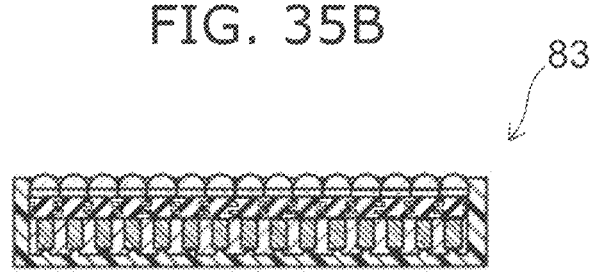

FIGS. 35A to 35C are cross-sectional views illustrating a method for manufacturing a solid imaging element according to the twenty-sixth embodiment.

First, in a manner similar to the twentieth embodiment described above, the processes shown in FIGS. 27A to 27C are performed. Descriptions of these processes are omitted here.

Next, as shown in FIG. 35A, the notches 160 are formed in the lower face of the semiconductor layer 114 in the solid imaging element 76. Accordingly, the imaging element 81 is formed. In FIG. 35A, the imaging element 81 is shown upside down. The notches 160 have the form of a plurality of grooves 161 extending, for example, in one direction. The grooves 161 are formed by a photolithographic process and etching process. When the grooves 161 is formed in silicon, the grooves 161 can be formed by, for example, dry etching in which sulfur hexafluoride ($SF_6$) is used. The depth of the grooves 161 is controlled by etching time and gas flow rates.

Next, as shown in FIG. 35B, the solid imaging element 81 is peeled off from the supporting substrate 157. In this way, as shown in FIG. 25, the solid imaging element 81 according to the twenty-third embodiment described above is manufactured.

Subsequently, as shown in FIG. 35C, the solid imaging element 83 may be formed by coating the solid imaging element 81 with the organic film 154.

Twenty-Seventh Embodiment

Next, a twenty-seventh embodiment will be described.

FIGS. 36A to 36F are cross-sectional views illustrating a method for manufacturing a solid imaging element according to the twenty-sixth embodiment.

First, in a manner similar to the twenty-first embodiment described above, the process shown in FIG. 28A is performed. Descriptions of this process are omitted here.

Then, as shown in FIG. 36A, the notches 160 are formed in the upper face of the interlayer insulating film 150. The notches 160 have the form of the plurality of grooves 161 extending in one direction, for example. The grooves 161 are formed by a photolithographic process and etching process. When the grooves 161 are formed in the interlayer insulating film 150 including a silicon oxide film, the grooves 161 can be formed by, for example, dry etching in which carbon tetrafluoride ($CF_4$) is used. The depth of the grooves 161 is controlled by etching time and gas flow rates.

Next, as shown in FIG. 36B, the supporting substrate 157 is bonded, via the adhesive layer 156, to the upper face of the semiconductor substrate 155.

Then, as shown in FIG. 36C, the lower part of the semiconductor substrate 155 is ground, and the semiconductor substrate 155 is formed into a thin layer. The semiconductor substrate 155 is formed into a thin layer, and thus is changed into the semiconductor layer 114.

Next, as shown in FIG. 36D, each color filter 152 is disposed on the lower face of the semiconductor layer 114 of each pixel 115. In FIG. 36D, the semiconductor layer 114 and the supporting substrate 157 are shown upside down. Then, each pixel-condensing microlens 153 is disposed on the lower face of the corresponding color filter 152 of each pixel 115. Accordingly, a solid imaging element 84 is formed.

Then, as shown in FIG. 36E, the solid imaging element 84 is peeled off from the supporting substrate 157. In this way, the solid imaging element 84 is formed.

Subsequently, as shown in FIG. 36F, a solid imaging element 85 may be formed by coating the solid imaging element 84 with the organic film 154.

Twenty-Eighth Embodiment

Next, a twenty-eighth embodiment will be described.

Figure 37:
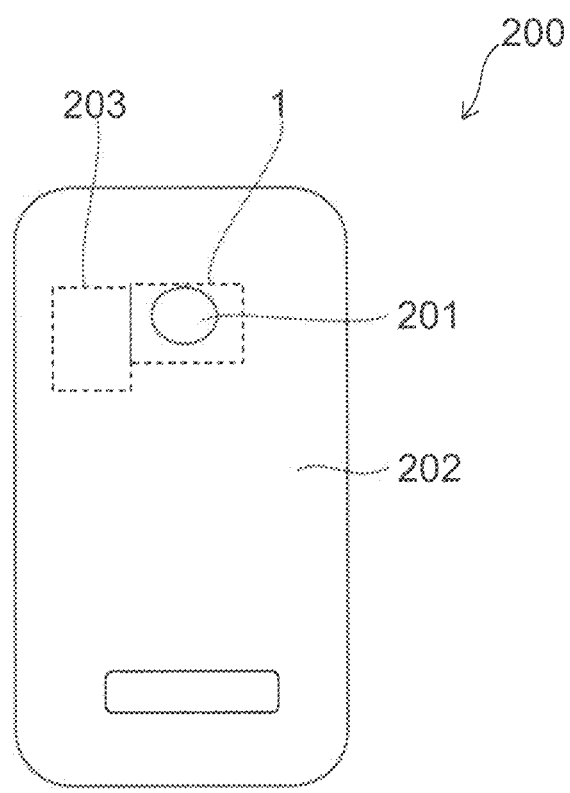
FIG. 37 shows a plane view illustrating a portable information terminal device according to a twenty-eighth embodiment.

FIG. 37 shows a plane view illustrating a portable information terminal device according to a twenty-eighth embodiment.

As shown in FIG. 37, a portable information terminal device 200 according to the embodiment is provided with a solid state imaging device 1.

The solid state imaging device 1, for example, is the solid state imaging device 1 according to the first embodiment. An imaging lens 201 of the solid state imaging device 1 is arranged on one face 202 of the portable information terminal device 200.

The portable information terminal device 200 is provided with a memory device 203 connected to the solid state imaging device 1.

Next, the operation of the portable information terminal device 200 according to the embodiment will be described.

An optical axis of an imaging lens 201 of the solid state imaging device 1 in the portable information terminal device 200 is directed to a subject. The subject is photographed by operating the solid state imaging device 1. The photographed image is recorded in the memory device 203. Furthermore, the photographed image is displayed in a display unit.

Next, the effect of the embodiment will be described.

The portable information terminal device 200 according to the embodiment realizes high integration by mounting the solid state imaging device 1.

According to the embodiments described above, it is possible to provide a solid state imaging device realizing high picture quality and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A solid state imaging device, comprising:
    a sensor substrate having a first face, the first face including a first pixel and a second pixel;
    a microlens array substrate including
        first and second lenses, and
        first and and second regions, the first region being provided between the first lens and the second lens, and the second lens being provided between the first region and the second region;
    a first connection post having a first end and a second end, the first end being bonded with the first pixel, and the second end being bonded with the first region;
    a second connection post having a third end and a fourth end, the third end being bonded with the second pixel, and the fourth end being bonded with the second region; and
    an imaging lens, the microlens array substrate being provided between the sensor substrate and the imaging lens, a light axis of the imaging lens crossing the first face at a first position, wherein
    a first distance between the first position and the first end is shorter than a second distance between the first position and the third end,
    the second distance is longer than a third distance between the light axis and the fourth end in a direction along the first face, and
    a first angle between the light axis and a first straight line passing the first end and the second end is smaller than a second angle between the light axis and the second straight line passing the third end and the fourth end.

2. The device according to claim 1, wherein the first connection post includes a material absorbing light having a visible wavelength range.

3. The device according to claim 1, wherein the sensor substrate is curved and the first face is recessed.

4. The device according to claim 3, wherein a first focal distance between a focal point of the imaging lens and the first pixel is same as a second focal distance between the focal point and the second pixel.

5. The device according to claim 3, wherein the sensor substrate has a second face opposite to the first face, and the second face has a notch.

6. The device according to claim 1, wherein the sensor substrate includes silicon.

7. The device according to claim 1, further comprising an organic film provided on the sensor substrate.

8. The device according to claim 7, wherein the organic film passes light having a visible wavelength.

9. The device according to claim 7, wherein the organic film includes parylene.

10. The device according to claim 1, wherein the first connection post includes a heat-soluble organic material.

11. The device according to claim 1, wherein the first connection post includes at least one selected from the group consisting of carbon black, pigment black 7, and titanium black.

12. The device according to claim 1, wherein the third end is connected with a third region on the first face not irradiated with a light passing through the first lens and not irradiated with another light passing through the second lens.

13. The device according to claim 1, wherein the microlens array substrate includes a plurality of microlenses including the first lens and the second lens, and the microlenses are arranged in a hexagonal close-packed manner on the microlens array substrate.

14. The device according to claim 1, wherein an air gap is provided between the sensor substrate and the microlens array substrate.

15. A portable information terminal device comprising:
    a solid state imaging device,
    the solid state imaging device including:
    a sensor substrate having a first face, the first face including a first pixel and a second pixel;
    a microlens array substrate including
        first and second lenses, and
        first and second regions, the first region being provided between the first lens and the second lens, and the second lens being provided between the first region and the second region;
    a first connection post having a first end and a second end, the first end being bonded with the first pixel, and the second end being bonded with the first region; and
    a second connection post having a third end and a fourth end, the third end being bonded with the second pixel, and the fourth end being bonded with the second region; and
    an imaging lens, the microlens array substrate being provided between the sensor substrate and the imaging lens, a light axis of the imaging lens crossing the first face at a first position,
    wherein a first distance between the first position and the first end is shorter than a second distance than a second distance between the first position and the third end, and the second distance is longer than a third distance between the light axis and the fourth end in a direction along the first face, and a first angle between the light axis and a first straight line passing the first end and the second end is smaller than a second angle between the light axis and the a second straight line passing the third end and the fourth end.

16. A method for manufacturing a solid state imaging device, comprising:

forming a plurality of pixels on an upper face of a semiconductor substrate;

forming a connection post with one end bonded to the upper face;

forming a plurality of microlenses on a transparent substrate; and bonding another end of the connection post to a region between the microlenses on the transparent substrate, wherein forming the connection post includes:

forming a first sacrifice layer on the semiconductor substrate;

forming a first mask having a first opening formed on the first sacrifice layer;

etching the first sacrifice layer using the first mask; removing the first mask;

embedding a material for the post into an etched part of the first sacrifice layer;

removing the first sacrifice layer while leaving the embedded material for the post;

forming a second sacrifice layer on the semiconductor substrate and the embedded material for the post;

forming a second mask having a second opening formed on the second sacrifice layer;

etching the second sacrifice layer using the second mask; removing the second mask;

embedding a material for the post into an etched part of the second sacrifice layer; and removing the second sacrifice layer while leaving the embedded material for the post, and wherein when the first mask and the second mask are attached together, the first opening and the second opening overlap.

17. A method for manufacturing a solid state imaging device, comprising:

forming a plurality of pixels on an upper face of a semiconductor substrate;

forming a first connection post with one end bonded to the upper face;

forming a plurality of microlenses on a transparent substrate;

forming a second connection post with one end bonded to a region between the microlenses on the transparent substrate; and bonding another end of the first connection post and another end of the second connection post together.

* * * * *